US009167694B2

(12) United States Patent
Sundaram et al.

(10) Patent No.: US 9,167,694 B2
(45) Date of Patent: Oct. 20, 2015

(54) ULTRA-THIN INTERPOSER ASSEMBLIES WITH THROUGH VIAS

(75) Inventors: Venkatesh V. Sundaram, Johns Creek, GA (US); Rao R. Tummala, Grennsboro, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 500 days.

(21) Appl. No.: 13/285,912

(22) Filed: Oct. 31, 2011

(65) Prior Publication Data

US 2012/0106117 A1 May 3, 2012

Related U.S. Application Data

(60) Provisional application No. 61/409,221, filed on Nov. 2, 2010.

(51) Int. Cl.
*H05K 1/11* (2006.01)
*H05K 7/02* (2006.01)
(Continued)

(52) U.S. Cl.
CPC .......... *H05K 1/141* (2013.01); *H01L 21/76898* (2013.01); *H01L 23/3677* (2013.01); *H01L 23/49822* (2013.01); *H01L 23/49827* (2013.01); *H01L 25/0652* (2013.01); *H01L 25/0657* (2013.01); *H01L 25/18* (2013.01); *H01L 23/49816* (2013.01); *H01L 2224/16145* (2013.01); *H01L 2224/16146* (2013.01); *H01L 2224/16225* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01);
(Continued)

(58) Field of Classification Search
CPC ....... H05K 1/112; H05K 1/141; H05K 1/144; H05K 3/368; H05K 3/301; H05K 3/429; H05K 7/023; H05K 2201/10606; H05K 2201/096; H05K 2201/09509; H01L 25/0657
USPC ......... 361/728, 729, 735, 760, 784, 790, 807, 361/810; 174/262, 266; 257/686, 777, 257/E23.06, E23.061
See application file for complete search history.

(56) References Cited

U.S. PATENT DOCUMENTS 4,875,982 A * 10/1989 Velie ................................ 205/50
5,598,036 A * 1/1997 Ho .................................. 257/738
(Continued)

*Primary Examiner* — Hoa C Nguyen
(74) *Attorney, Agent, or Firm* — Troutman Sanders LLP; Ryan A. Schneider; Troy S. Kleckley

(57) ABSTRACT

A 3D interconnect structure comprising an ultra-thin interposer having a plurality of ultra-high density of through-via interconnections defined therein. The 3D interposer electrically connects first and second electronic devices in vertical dimension and has the same or similar through-via density as the first or second electronic devices it connects. The various embodiments of the interconnect structure allows 3D ICs to be stacked with or without TSVs and increases bandwidth between the two electronic devices as compared to other interconnect structures of the prior art. Further, the interconnect structure of the present invention is scalable, testable, thermal manageable, and can be manufactured at relatively low costs. Such a 3D structure can be used for a wide variety of applications that require a variety of heterogeneous ICs, such as logic, memory, graphics, power, wireless and sensors that cannot be integrated into single ICs.

26 Claims, 27 Drawing Sheets

(51) Int. Cl.

| | |
|---|---|
| *H05K 1/14* | (2006.01) |
| *H01L 23/498* | (2006.01) |
| *H01L 25/065* | (2006.01) |
| *H01L 21/768* | (2006.01) |
| *H01L 23/367* | (2006.01) |
| *H01L 25/18* | (2006.01) |
| *H05K 3/34* | (2006.01) |

(52) U.S. Cl.
CPC ............... *H01L2225/06513* (2013.01); *H01L 2225/06517* (2013.01); *H01L 2225/06541* (2013.01); *H01L 2225/06548* (2013.01); *H01L 2225/06565* (2013.01); *H01L 2225/06572* (2013.01); *H01L 2225/06589* (2013.01); *H01L 2924/09701* (2013.01); *H01L 2924/15153* (2013.01); *H01L 2924/15192* (2013.01); *H01L 2924/15311* (2013.01); *H01L 2924/15321* (2013.01); *H01L 2924/19105* (2013.01); *H05K 3/3436* (2013.01); *H05K 2201/10378* (2013.01); *H05K 2201/10515* (2013.01)

(56) References Cited

U.S. PATENT DOCUMENTS

| | | | | |
|---|---|---|---|---|
| 7,834,450 | B2* | 11/2010 | Kang | 257/724 |
| 7,863,524 | B2* | 1/2011 | Shioga et al. | 174/260 |
| 8,207,453 | B2* | 6/2012 | Ma et al. | 174/262 |
| 2003/0164550 | A1* | 9/2003 | Lee et al. | 257/777 |
| 2004/0201095 | A1* | 10/2004 | Palmer et al. | 257/700 |
| 2006/0208351 | A1* | 9/2006 | Poo et al. | 257/693 |
| 2006/0240595 | A1* | 10/2006 | Lee et al. | 438/108 |
| 2008/0173999 | A1* | 7/2008 | Chung et al. | 257/686 |
| 2009/0051046 | A1* | 2/2009 | Yamazaki et al. | 257/777 |
| 2009/0175000 | A1* | 7/2009 | Japp et al. | 361/679.55 |
| 2010/0044870 | A1* | 2/2010 | Yamaji et al. | 257/773 |
| 2010/0171197 | A1* | 7/2010 | Chang et al. | 257/621 |
| 2011/0210444 | A1* | 9/2011 | Jeng et al. | 257/738 |

* cited by examiner (a)            (b)

ULTRA-THIN INTERPOSER ASSEMBLIES WITH THROUGH VIAS

CROSS-REFERENCE TO RELATED APPLICATION

This application claims the benefit of U.S. Provisional Patent Application Ser. No. 61/409,221, filed 2 Nov. 2010, which is incorporated herein by reference in its entirety as if fully set forth below.

BACKGROUND

1. Field

The various embodiments of the present invention relate to ultra-small pitch interconnect structures comprising of ultra-thin interposers having ultra-high density through vias defined therein.

2. Description of Related Art

The increasing number of smart and mobile phone applications, including video streaming, 3D graphics, camera-functions, and gaming, are driving the demand for logic to memory bandwidth (BW) at increasing levels without an increase in power consumption. Bandwidth is defined as bit rate per pin or I/O and the number of I/Os. Bit rate per pin is influenced by many factors, the most important factor being interconnection length between two devices. The main elements that influence bandwidth, therefore, are (1) the number of parallel interconnections between a logic and memory (IC) devices in a given area, referred to as I/O density, determined by the pitch of interconnections and (2) the length of such interconnections between the logic and memory devices.

FIG. 1 illustrates various 3D packaging schemes of the prior art and an illustration of an exemplary embodiment of the present invention (FIG. 1e). Briefly described, the packaging schemes are, for example, a system-in-package (SIP) structure (FIG. 1a), a package-on-package (POP) structure (FIG. 1b), a face-to-face (F2F) structure (FIG. 1c), and a logic on bottom stack (FIG. 1d) structure. The logic on bottom stack structure is a next generation configuration that utilizes 3D ICs with complex and expensive through silicon vias (TSVs).

The wire-bonded SIP and POP structures are limited in the number of chip-to-chip interconnections and the interconnection length, preventing these structures from providing high bandwidths without a significant increase in power consumption. The F2F structure achieves finer-pitch I/Os and thus increases the number of chip-to-chip interconnections, however, the design is limited to two chips and therefore cannot be scaled to multiple chips or sub-systems.

Silicon interposers with very high I/Os at finer pitches offer potential solutions to these problems of the prior art configurations, as multiple ICs may be placed side by side on the silicon interposer and connected through lateral re-distribution layer wiring. Such a structure has two limitations, however. First, this structure is very expensive to manufacture, attributed to the small number of interposers produced from 200-300 mm wafers as well as the expensive back-end-of-line (BEOL) processes. The second limitation is related to the electrical signal delay, due to both electrical lossiness of silicon as well the long wire lengths with high resistance.

An entirely new, complex, and expensive technology, called "3D ICs with TSVs", is being developed worldwide in an effort to achieve ultra-high bandwidth using TSVs fabricated within logic, memory, and other ICs, and stacking these devices one on top of the other to enable ultra-fine pitch and ultra-short interconnections, as illustrated in FIG. 1d. However, this form of multi-die stacking with TSVs imposes great challenges in forming TSVs within complementary metal oxide semiconductor (CMOS) chips, power delivery, testability, reliability, and thermal management of logic chip, all of which remain major barriers in achieving high bandwidth for 3D ICs. Additionally, organic, ceramic, and glass carriers having conductive through vias have been described in prior art, however, they do not operate at high bandwidths because of coarse pitch and long interconnections. The interconnect structure of the present invention, a three-dimensional (3D) interposer, achieves the same ultra high density of interconnections at ultra short lengths, very similar to TSVs within the logic and memory devices. Such a structure serves many applications for heterogenous stacking of ICs that cannot be integrated into a single IC. One such application is for providing high bandwidth, comparing favorably over 3D ICs with TSVs, as it is scalable, testable, thermal manageable, and can be manufactured at lower costs.

BRIEF SUMMARY

Exemplary embodiments of the present invention provide a 3D interposer interconnect structure, comprising an interposer having a first side and a second side, the interposer being about 20 to about 200 micrometers in thickness; and a plurality of through-vias defined within the interposer extending at least from the first side to the second side of the interposer, wherein the thickness of the interposer to via diameter aspect ratio is about 1:1 to about 10:1; and wherein the interposer electrically connects first and second electronic devices on either side of the through-vias and has the same or substantially the same through-via interconnect density as the first and second electronic devices it connects.

Other exemplary embodiments of the present invention provide a testable interposer interconnect structure, comprising an interposer having a first side and a second side; and a plurality of through vias defined within the interposer extending at least from the first side to the second side of the interposer; wherein the interposer electrically connects first and second electronic devices on either side of the through-via and has the same or substantially the same through-via interconnect density as the first and second electronic devices it connects; and wherein the interposer comprises test pads on the first and second sides of the interposer to enable testing of electronic devices attached and electrically connected to at least one of the first and second sides of the interposer.

Further exemplary embodiments of the present invention provide ease of thermal management interposer interconnect structure, comprising: an interposer having a first side and a second side; and a plurality of through-vias defined within the interposer extending at least from the first side to the second side of the interposer; and wherein the interposer electrically connects first and second electronic devices on either side of the through-via and has the same or substantially the same through-via interconnect density as the first and second electronic devices it connects; and further wherein the first and second electronic devices are connected by a plurality of electrically and thermally conducting through-vias, wherein the plurality of through-vias are distributed within the interposer and provide localized thermal isolation or thermal conduction between the first and second electronic devices.

Additional exemplary embodiments of the present invention provide a scalable interposer interconnect structure, comprising: an interposer having a first side and a second side; and a plurality of through vias defined within the interposer extending at least from the first side to the second side of the interposer, wherein the thickness of the interposer to via diameter aspect ratio is about 1:1 to about 10:1; wherein the interposer electrically connects electronic devices and has the same through-via interconnect density as the electronic devices it connects; and wherein a plurality of electronic devices are attached to the first side of the interposer in a side-by-side configuration.

FIGURES

Figure 1A:
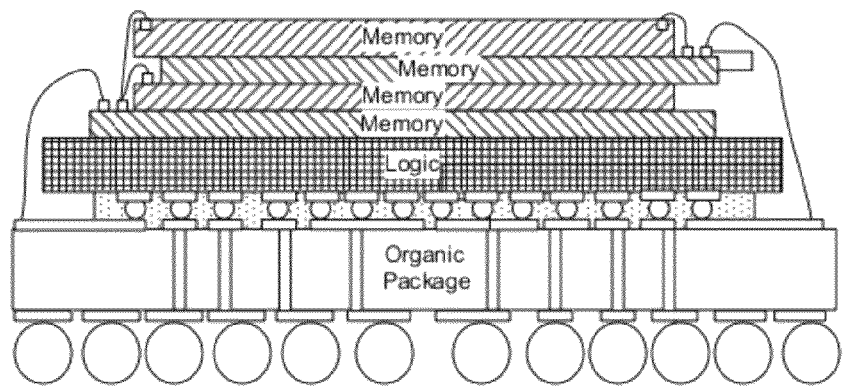
FIG. 1a illustrates a prior art system-in-package interconnect structure embodiment.
Figure 1B:
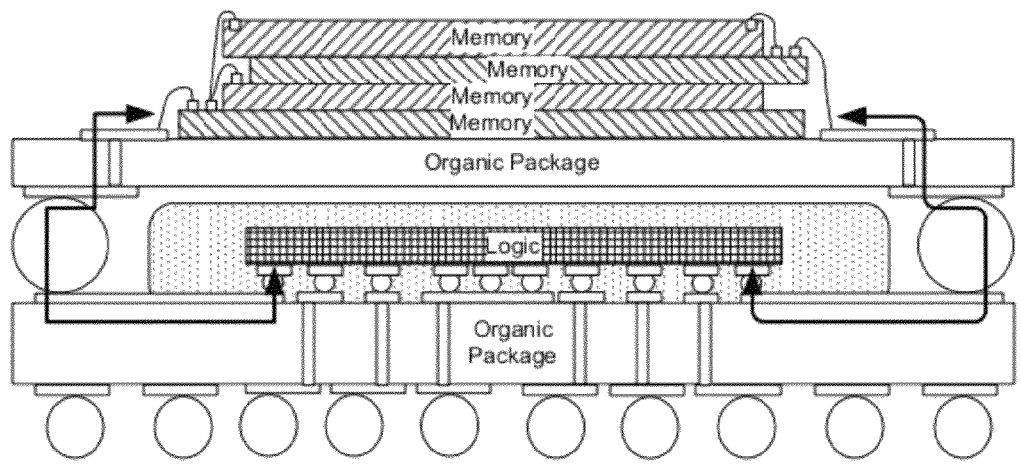
FIG. 1b illustrates a prior art package-on-package interconnect structure embodiment.
Figure 1C:
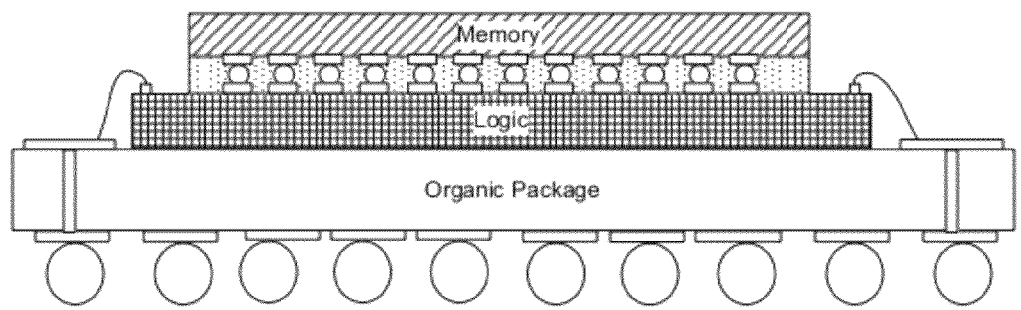
FIG. 1c illustrates a prior art face-to-face package interconnect structure embodiment.
Figure 1D:
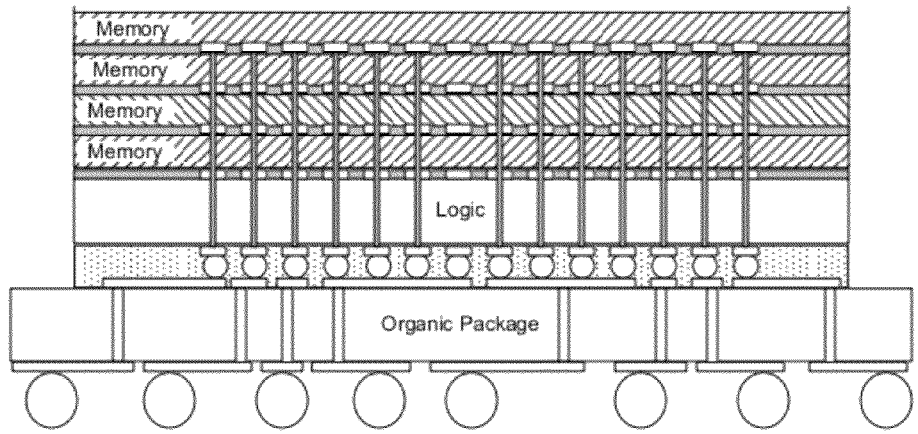
FIG. 1d illustrates a prior art logic-on-bottom stack interconnect structure embodiment.
Figure 1E:
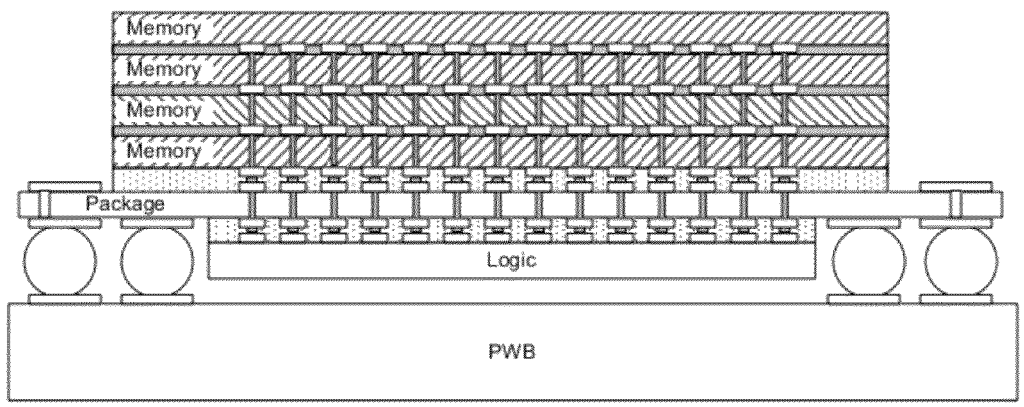
FIG. 1e illustrates an exemplary embodiment of an interconnect structure of the present invention comprising a 3D interposer defining a plurality of through vias.
Figure 2:
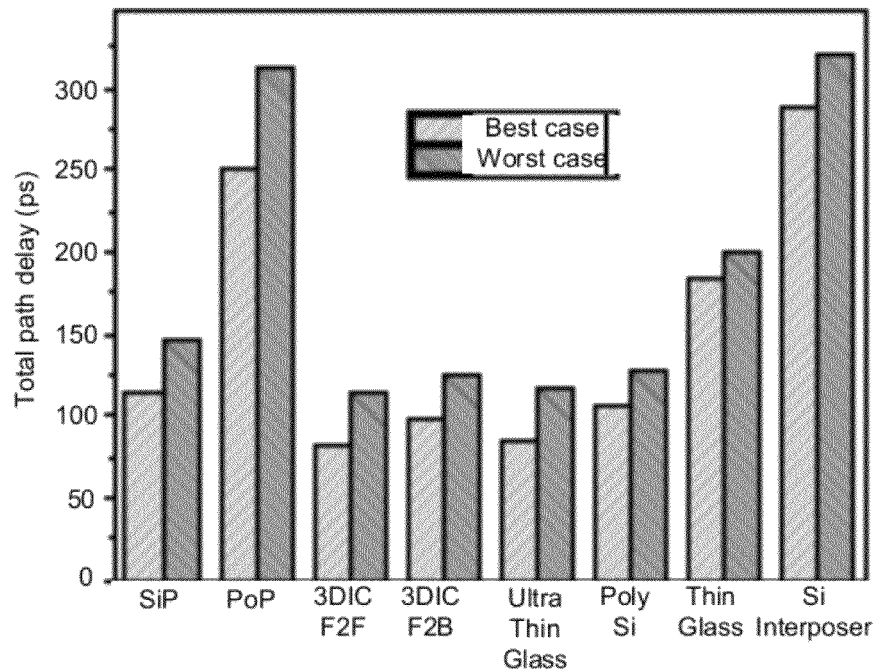

FIG. 2 graphically illustrates the bandwidth of the interconnect structure embodiments illustrated in FIGS. 1a-1e.

Figure 3:
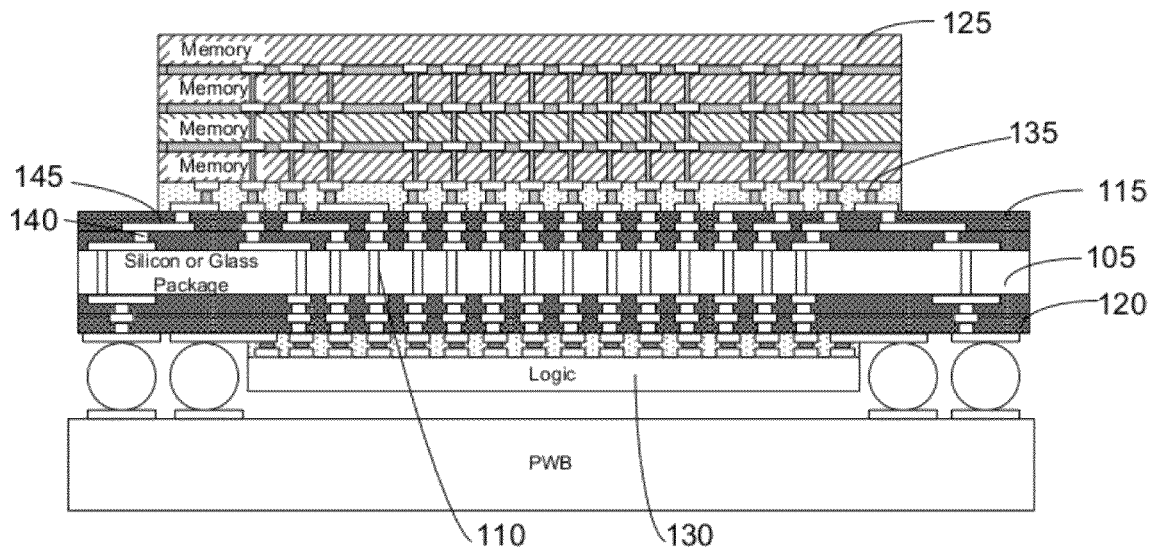

FIG. 3 illustrates another exemplary embodiment of the interconnect structure of the present invention comprising an interposer defining a plurality of through vias.

Figure 4:
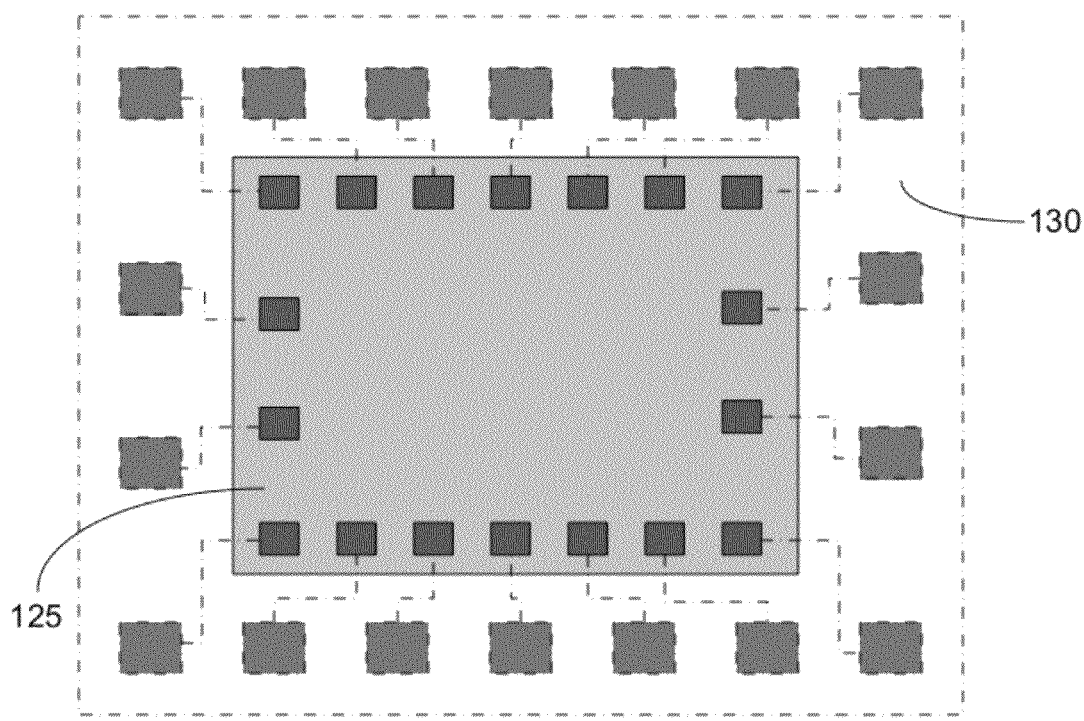
Figure 5A:
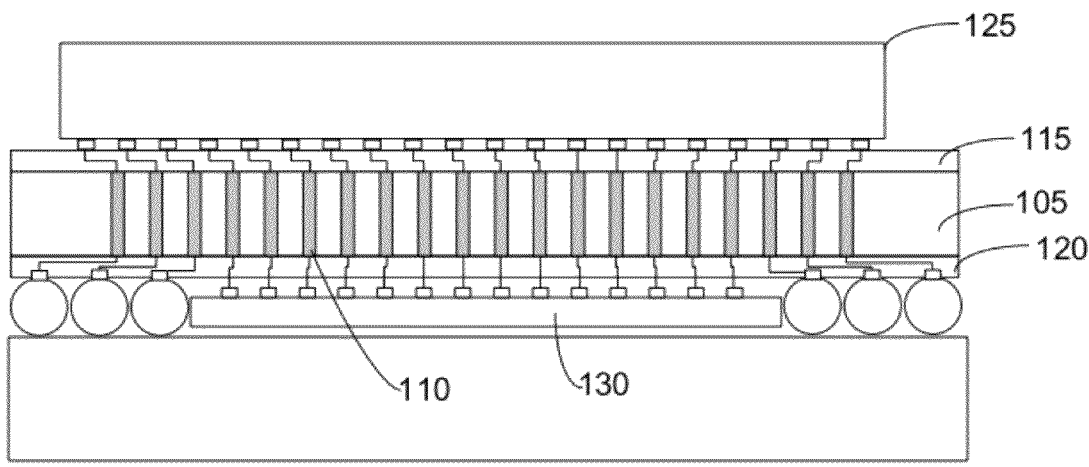
Figure 5B:
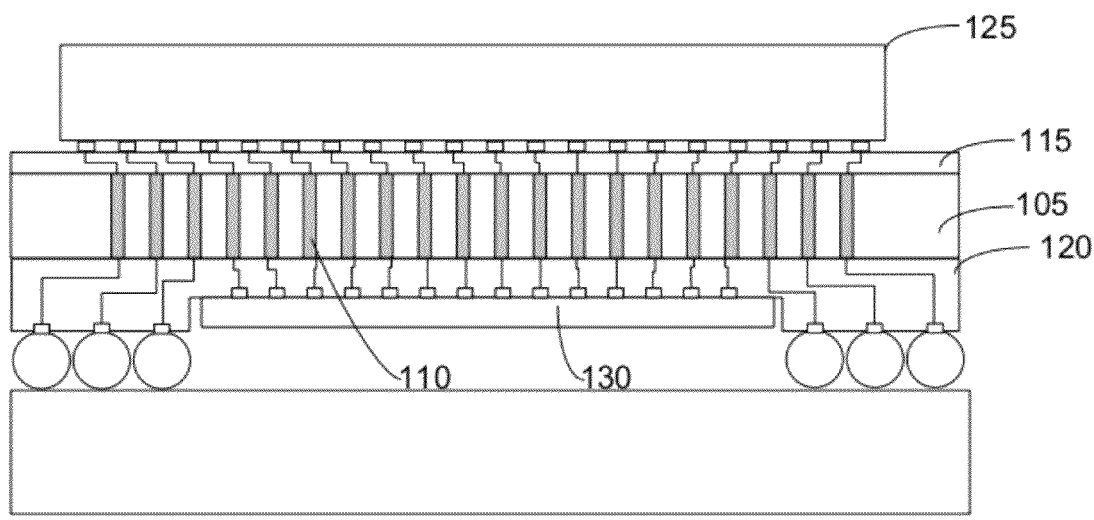
Figure 5C:
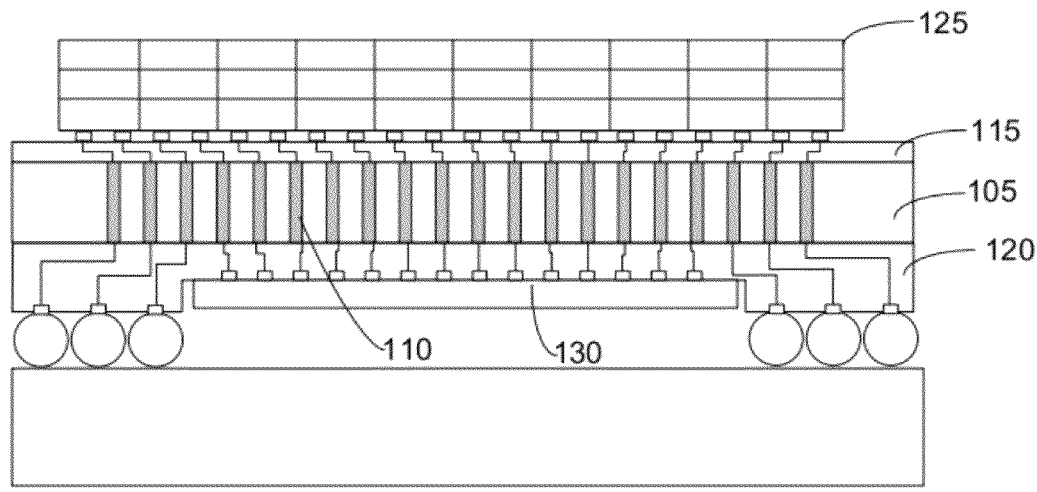
Figure 5D:
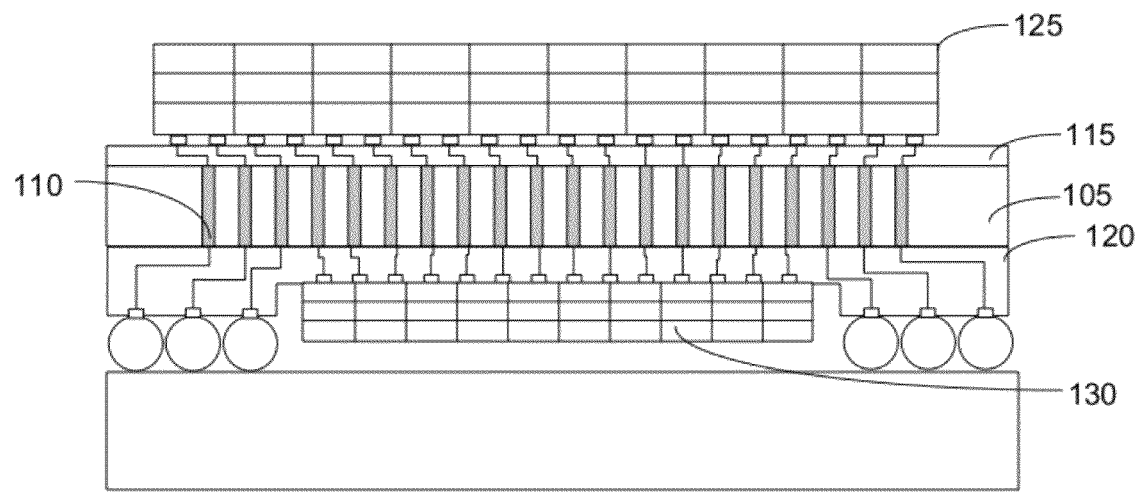

FIG. 4 illustrates a top view of the interconnect structure illustrated in FIG. 3.

FIGS. 5a-5d illustrate various exemplary embodiments of the interconnect structure of the present invention.

Figure 6:
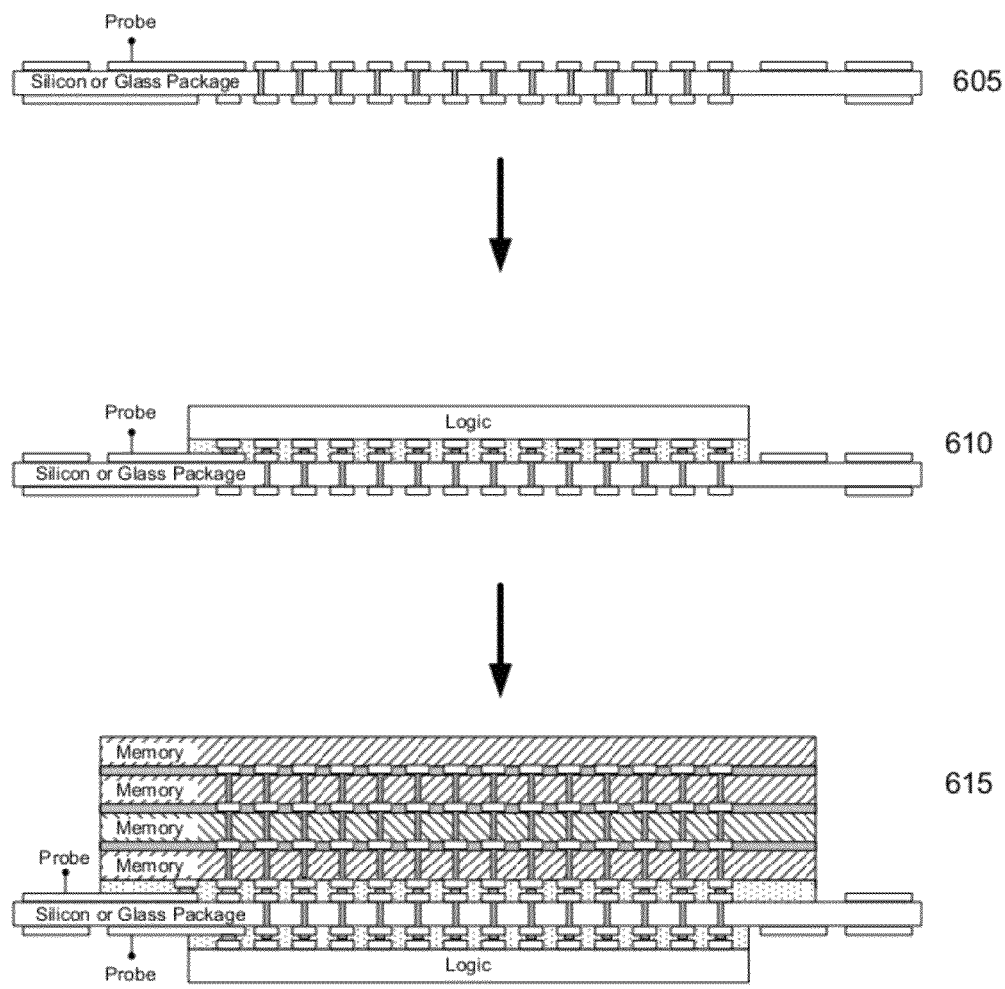

FIG. 6 illustrates a method of integrating and testing the interconnect structure of the present invention.

Figure 7:
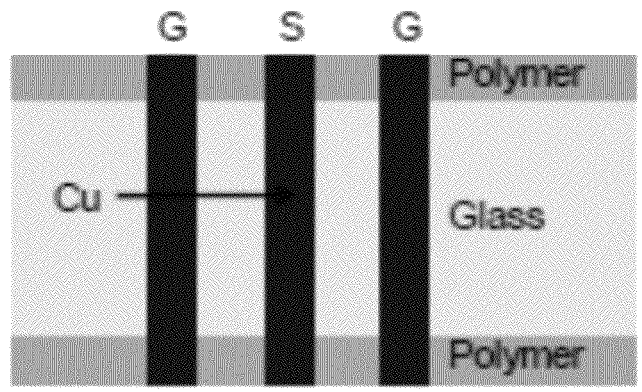

FIG. 7 illustrates a schematic model of through vias in a 3D glass interposer.

Figure 8:
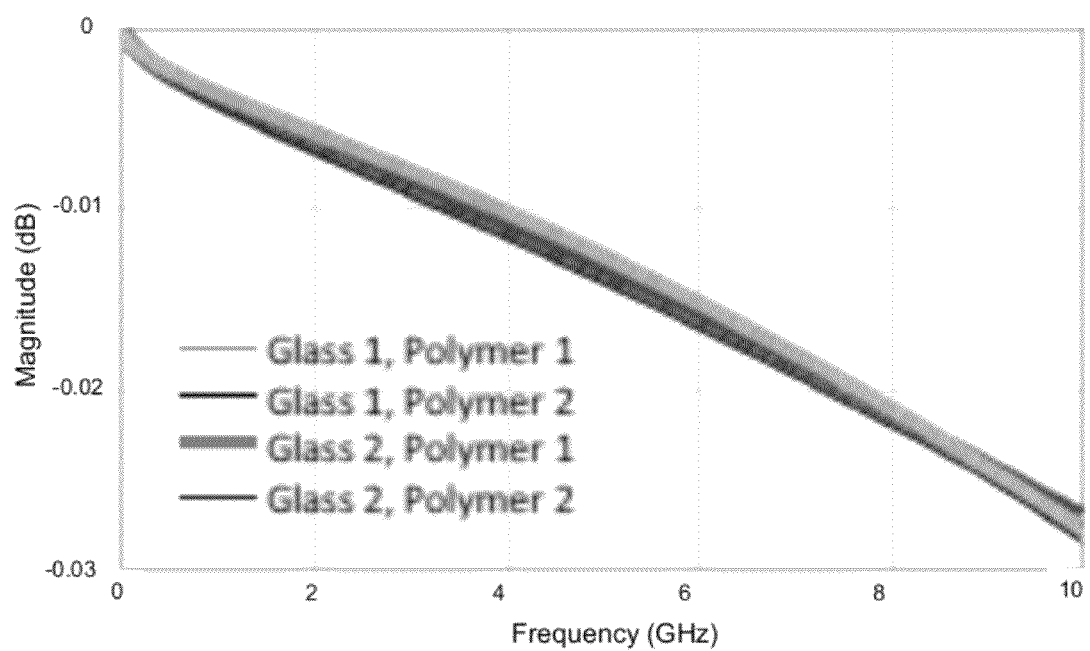

FIG. 8 graphically illustrates an insertion loss comparison for through vias in a glass interposer utilizing different glass and polymeric compositions FIGS. 9a and 9b illustrate a cross-sectional view of a copper-filled TPV and a conformal copper through via, respectively.

Figure 10:
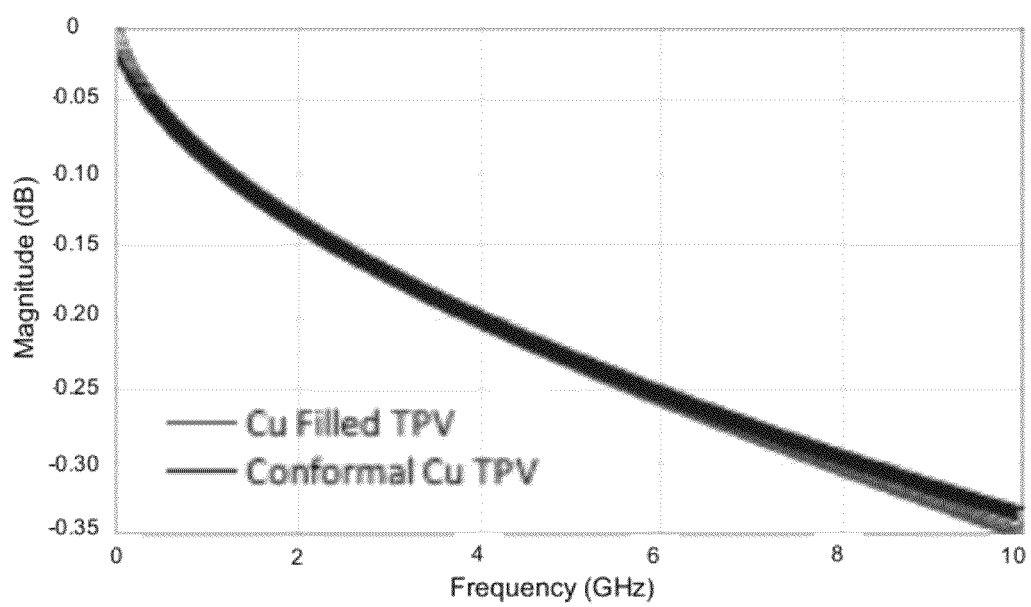

FIG. 10 graphically illustrates the effect of through-via metallization on its insertion loss.

Figure 11:
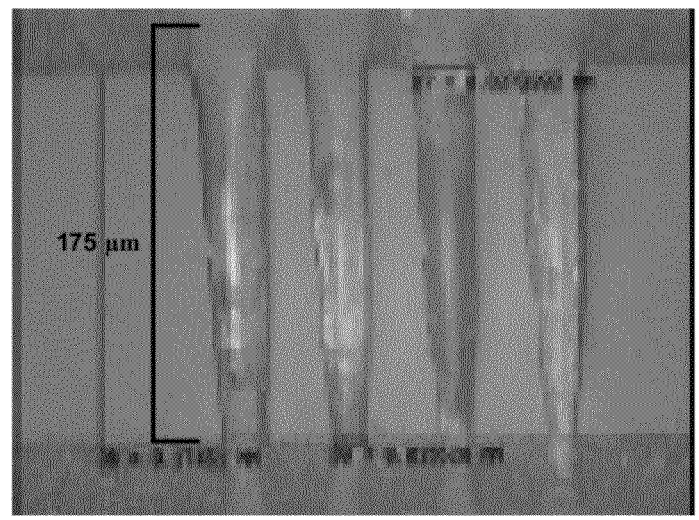

FIG. 11 provides a cross-sectional image of through vias in a polymer laminated glass.

Figure 12:
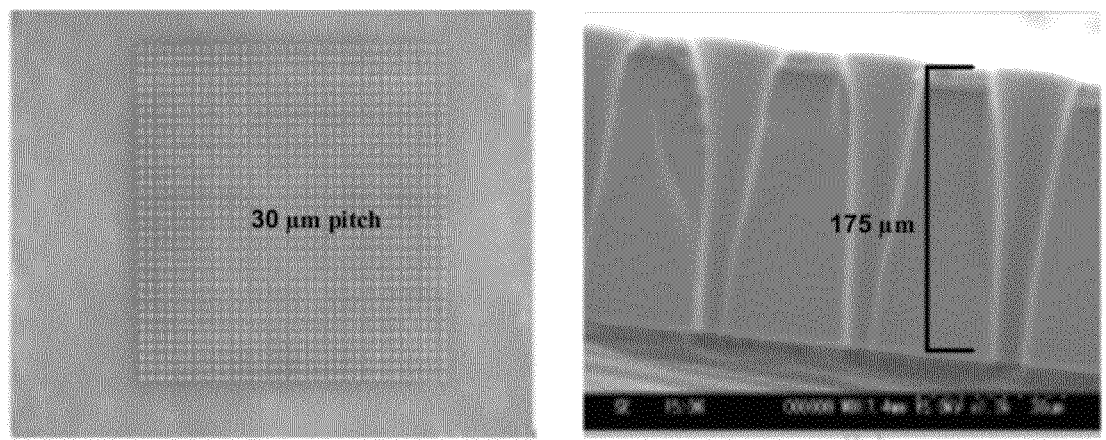

FIGS. 12a and 12b provide a top-view image and a cross-sectional view image, respectively, of a plurality of through vias.

Figure 13:
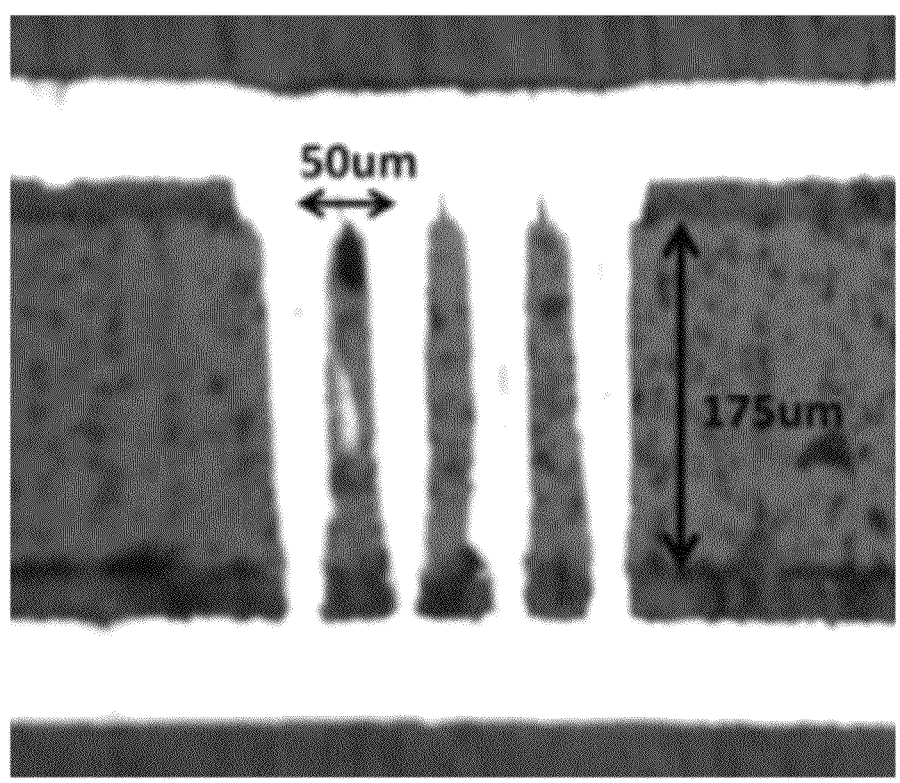

FIG. 13 provides an image of a plated fine pitch via in glass.

Figure 14:
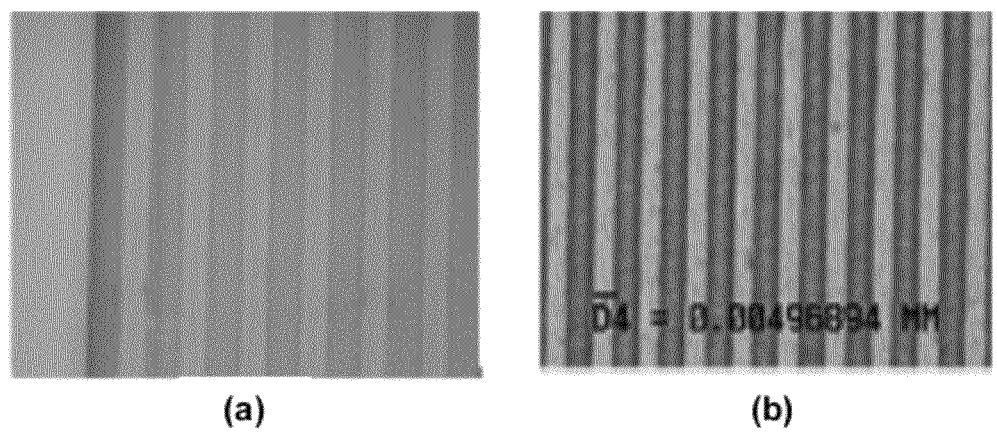

FIGS. 14a and 14b provide images showing the definition of fine line and space features of the through vias down to 10 μm and 5 μm, respectively.

Figure 15:
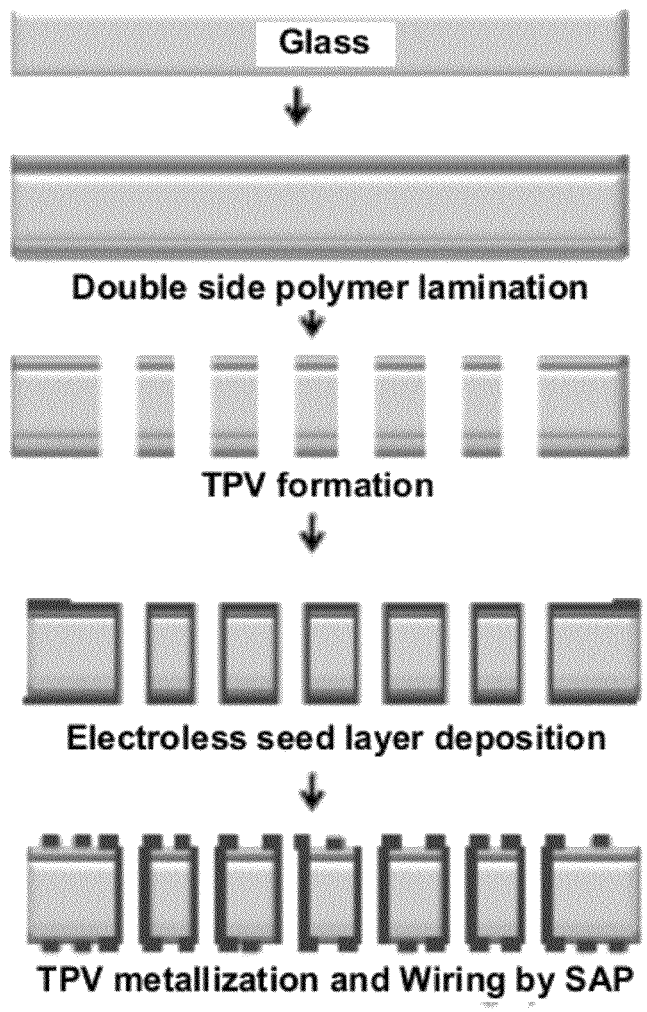

FIG. 15 illustrates the process flow for glass test vehicle fabrication.

Figure 16:
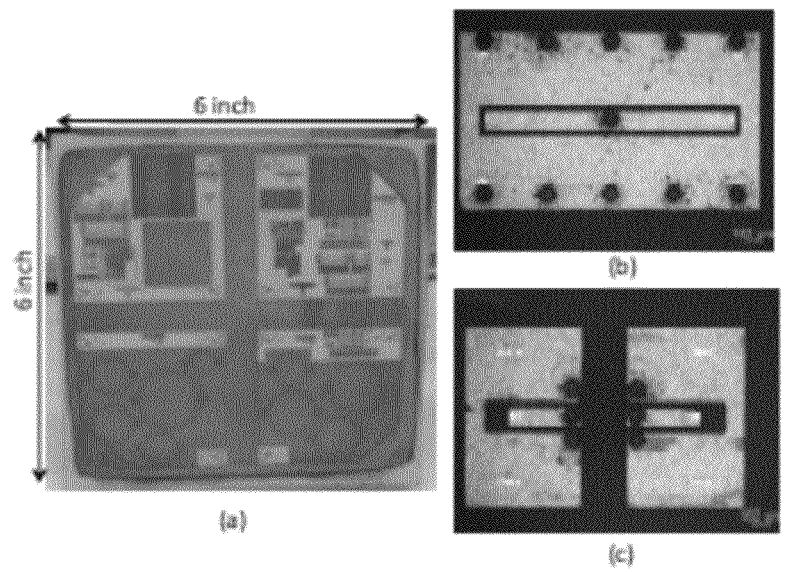

FIGS. 16a-16c illustrates a fabricated glass test vehicle.

Figure 17:
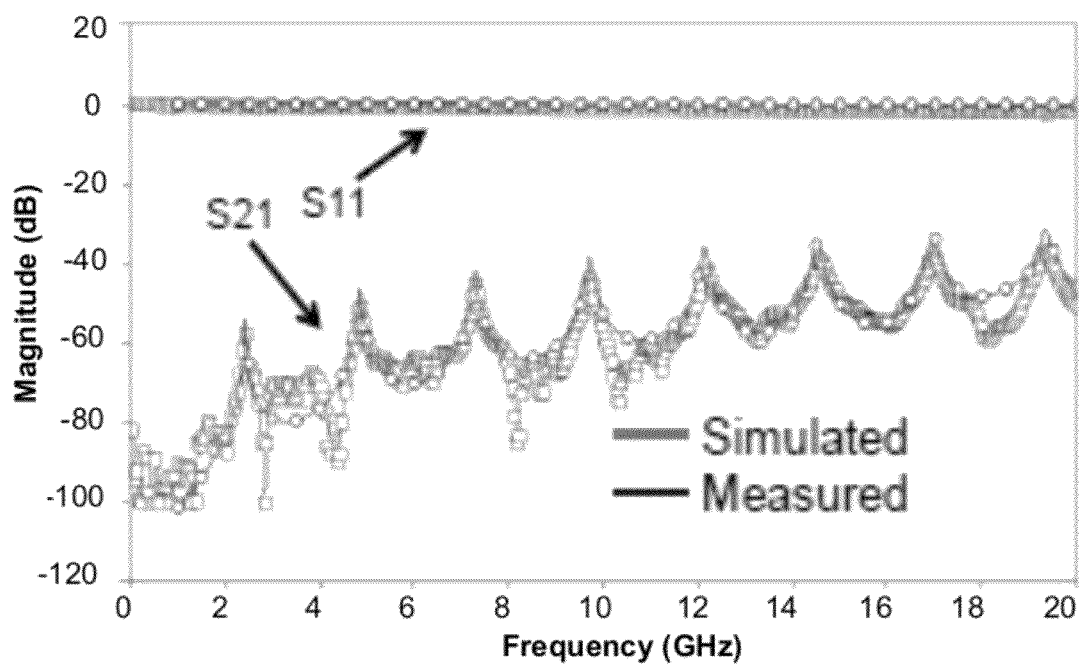

FIG. 17 graphically illustrates measurement and simulation plots of a ring resonator in a glass test vehicle.

Figure 18:
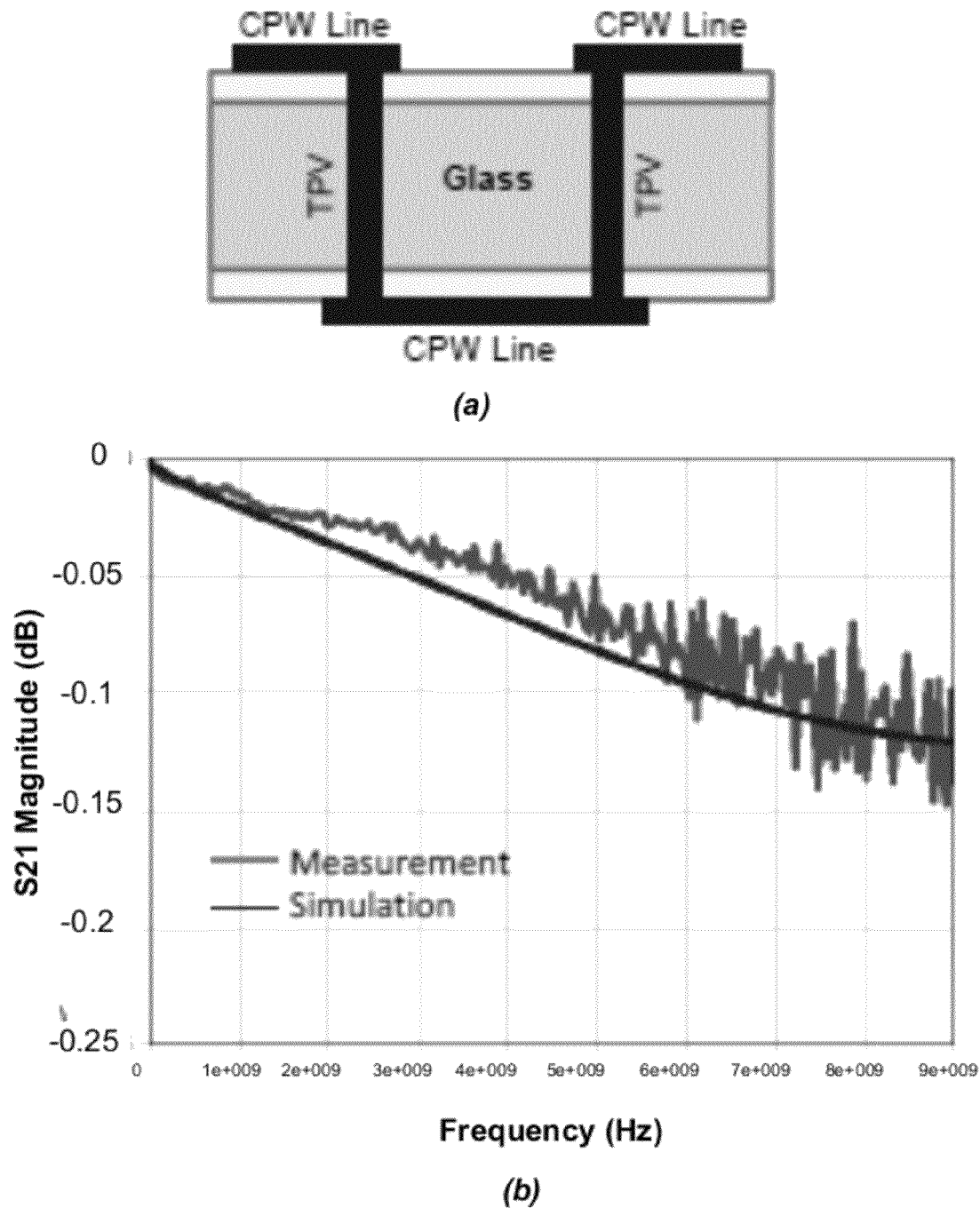

FIG. 18a illustrates a cross-sectional view of a CPW line to through-via transition structure.

FIG. 18b graphically illustrates the insertion loss plot of the CPW line to through-via transition structure illustrated in FIG. 18a.

Figure 19:
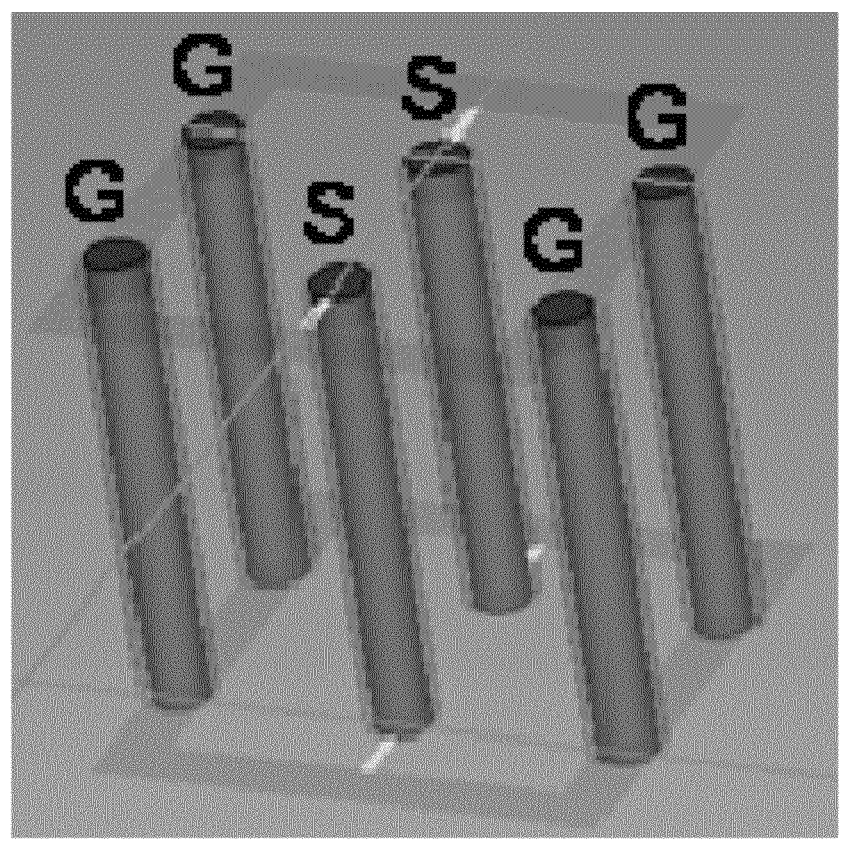

FIG. 19 illustrates a schematic model of a TPV in a silicon interposer.

Figure 20:
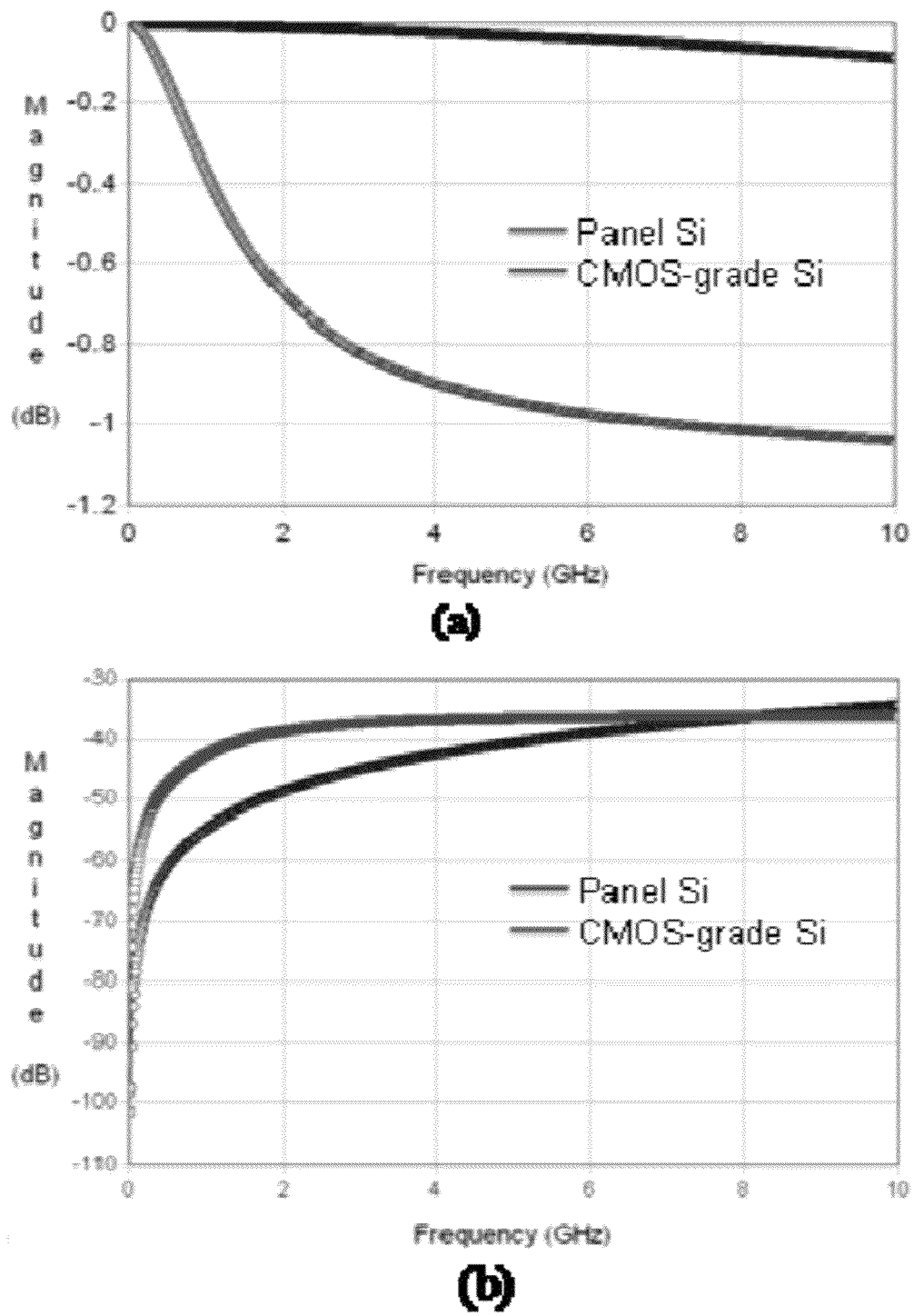

FIGS. 20a and 20b graphically illustrate insertion loss and far-end crosstalk plots, respectively, for through vias in CMOS grade and polycrystalline based silicon interposers.

Figure 21:
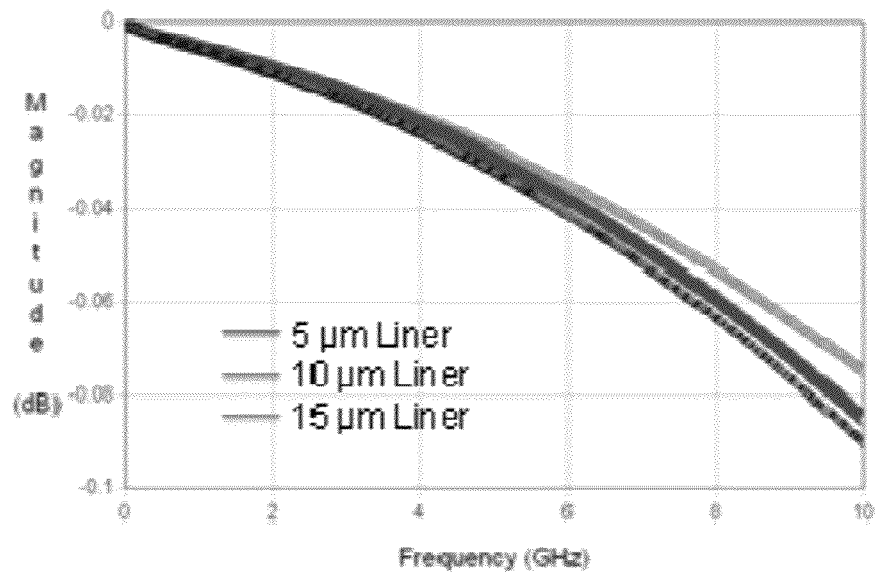
Figure 21:
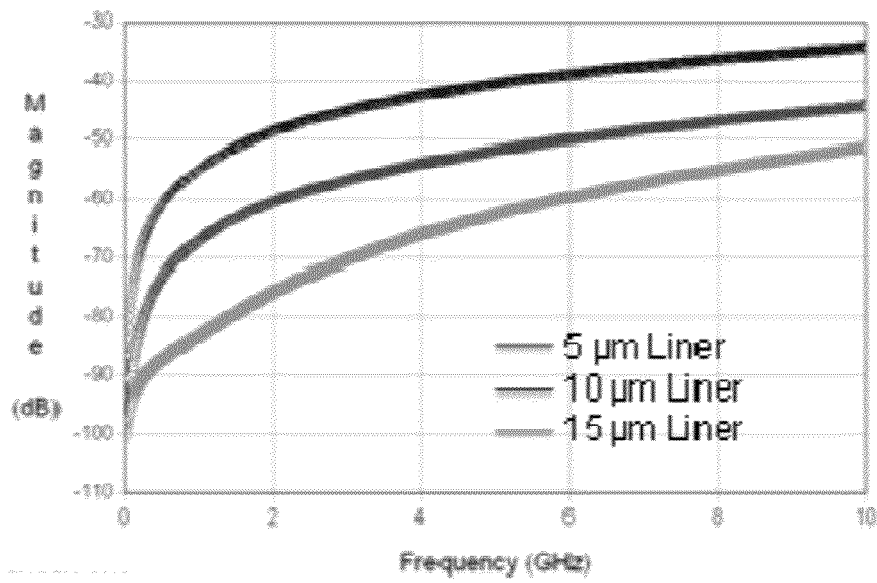

FIGS. 21a and 21b graphically illustrate insertion loss and far-end crosstalk plots, respectively, for through vias with different sidewall liner thicknesses.

Figure 22:
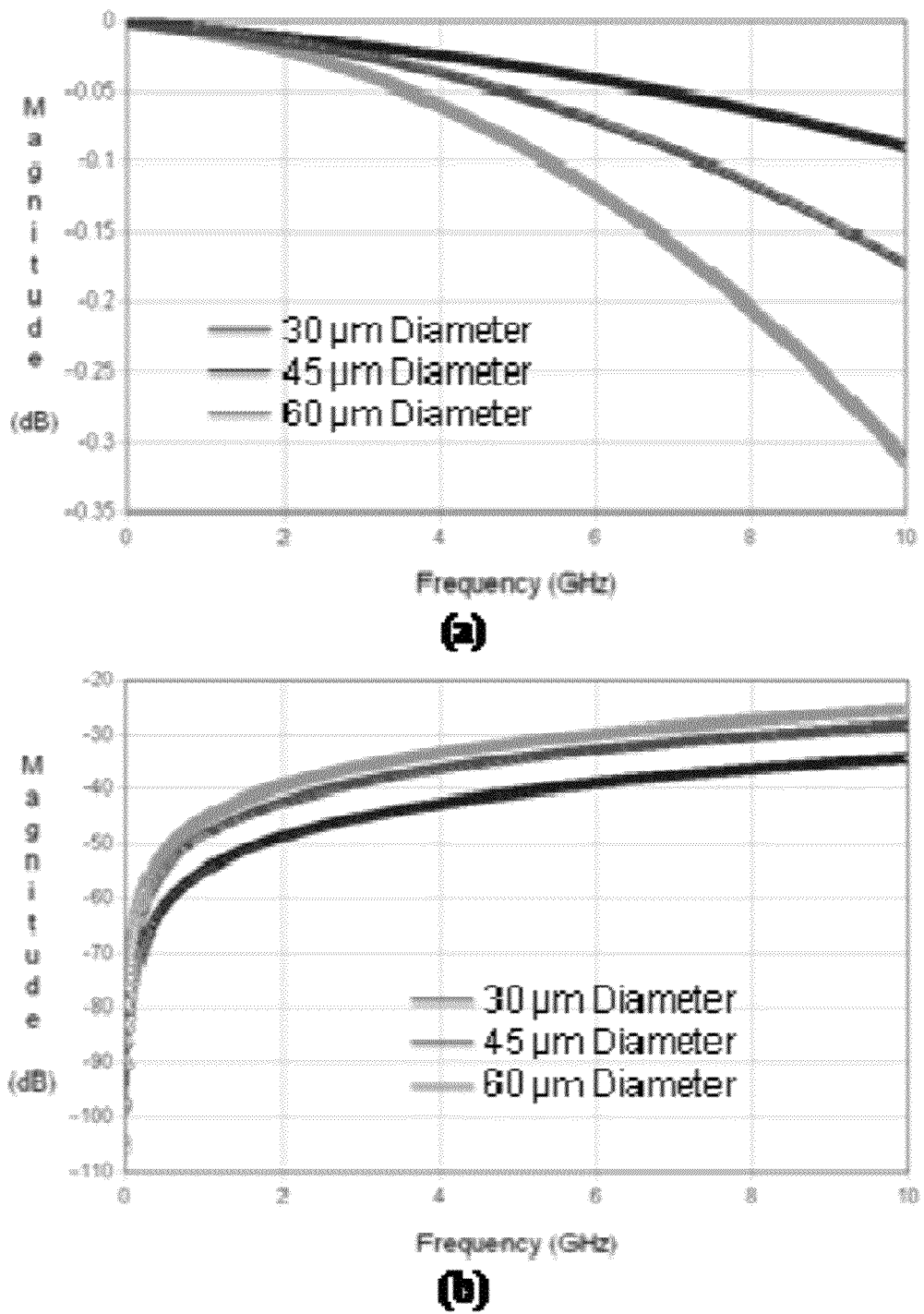

FIGS. 22a and 22b graphically illustrate insertion loss and far-end crosstalk plots, respectively, for through vias with different diameters.

Figure 23:
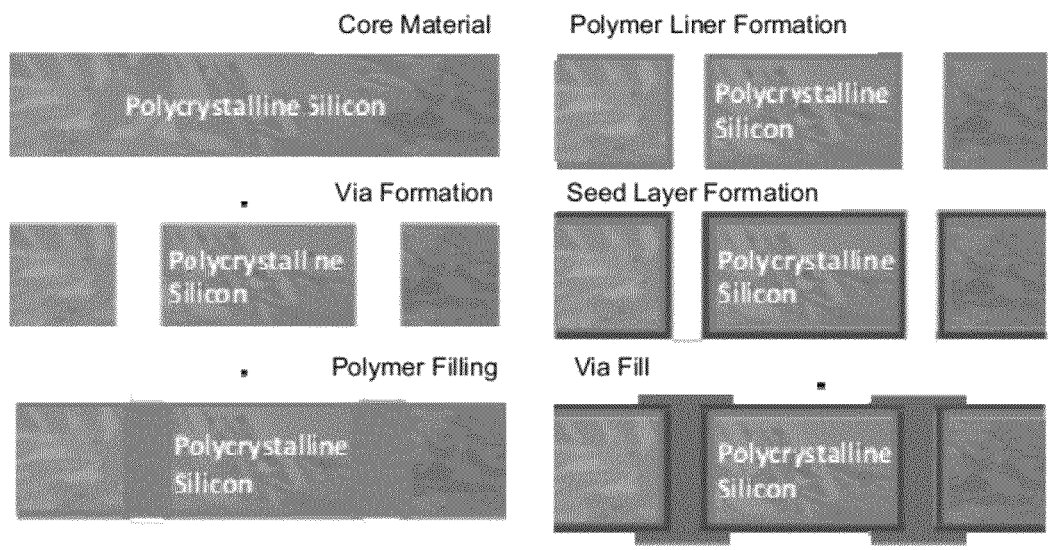

FIG. 23 illustrates the process flow for through-via fabrication.

Figure 24:

FIG. 24 provides top and bottom views of through vias fabricated by three types of lasers.

Figure 25:
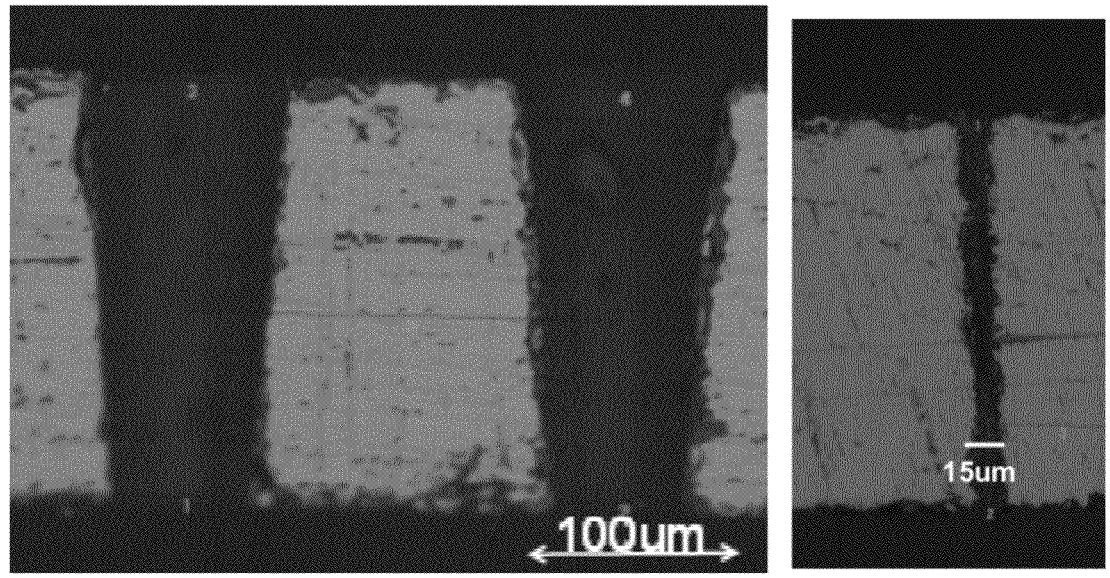

FIG. 25 illustrates a cross-sectional view of a through-via drilled in silicon by a UV laser.

Figure 26:
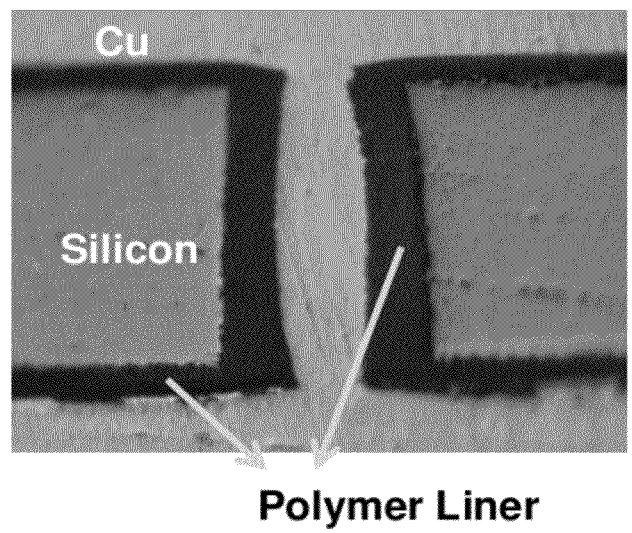

FIG. 26 illustrates a cross-sectional view of a polymer filled through-via in silicon.

Figure 27:
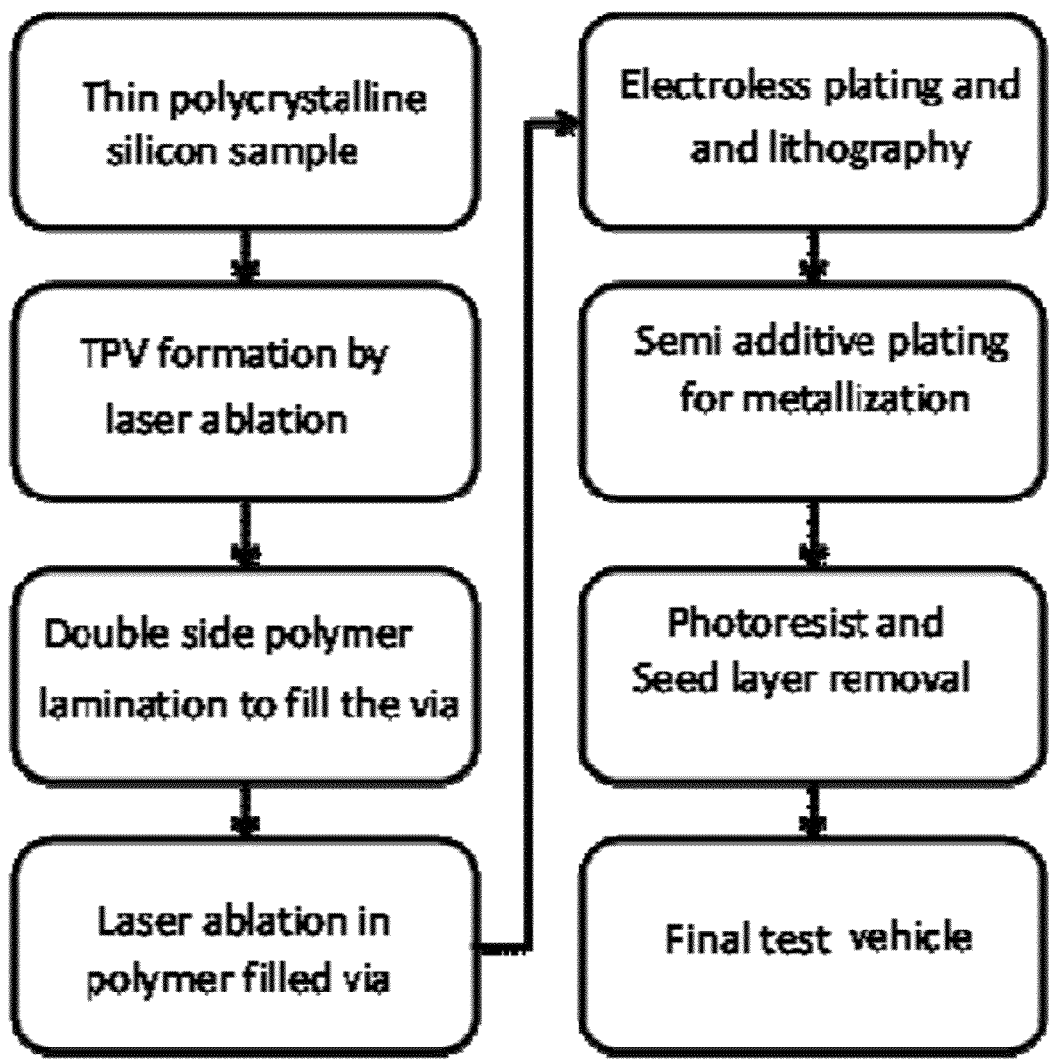

FIG. 27 illustrates the process flow for silicon test vehicle fabrication.

Figure 28:
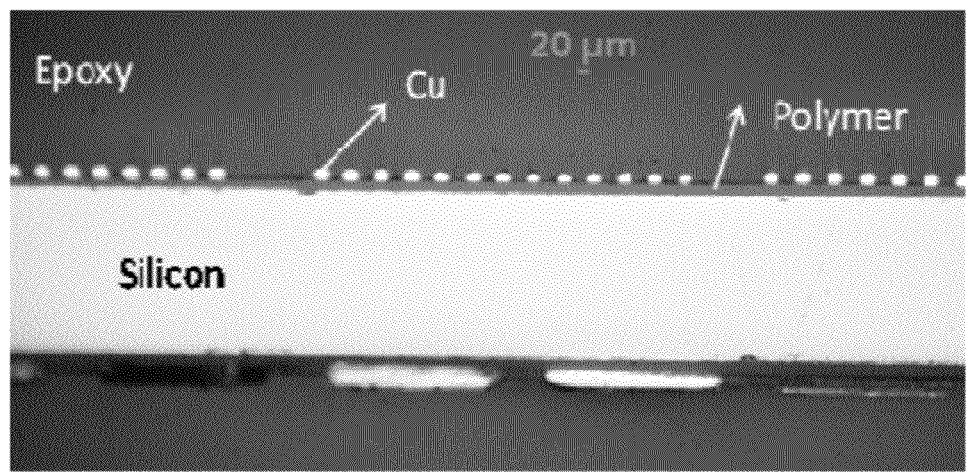

FIG. 28 illustrates a cross-sectional view of fine line structure on polymer laminated polycrystalline silicon.

Figure 29:
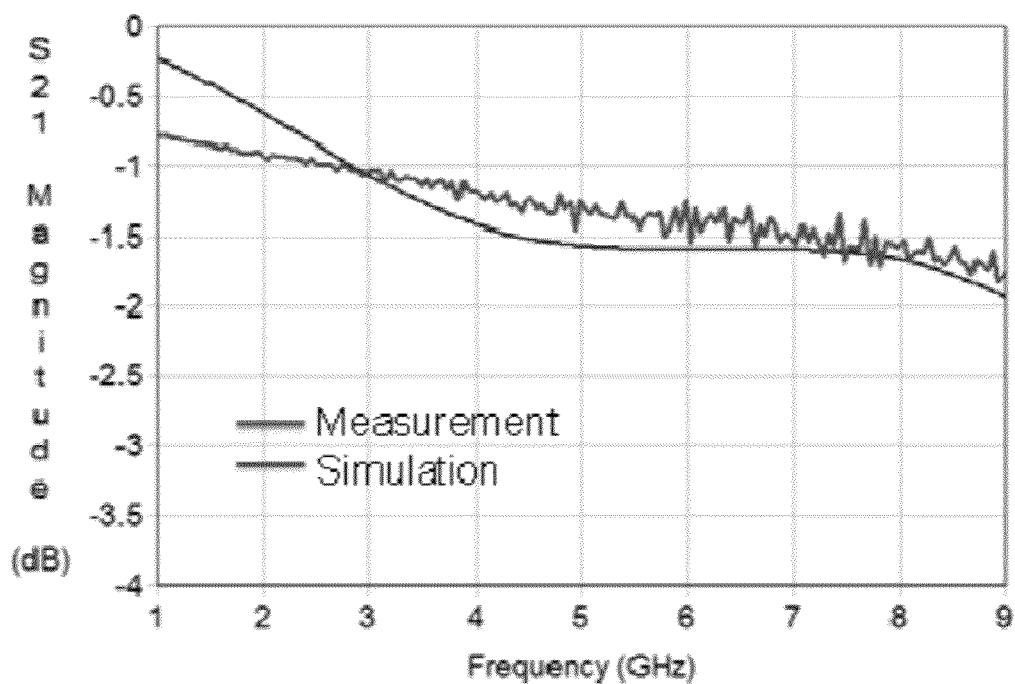

FIG. 29 graphically illustrates an insertion plot for a CPW line.

Figure 30:
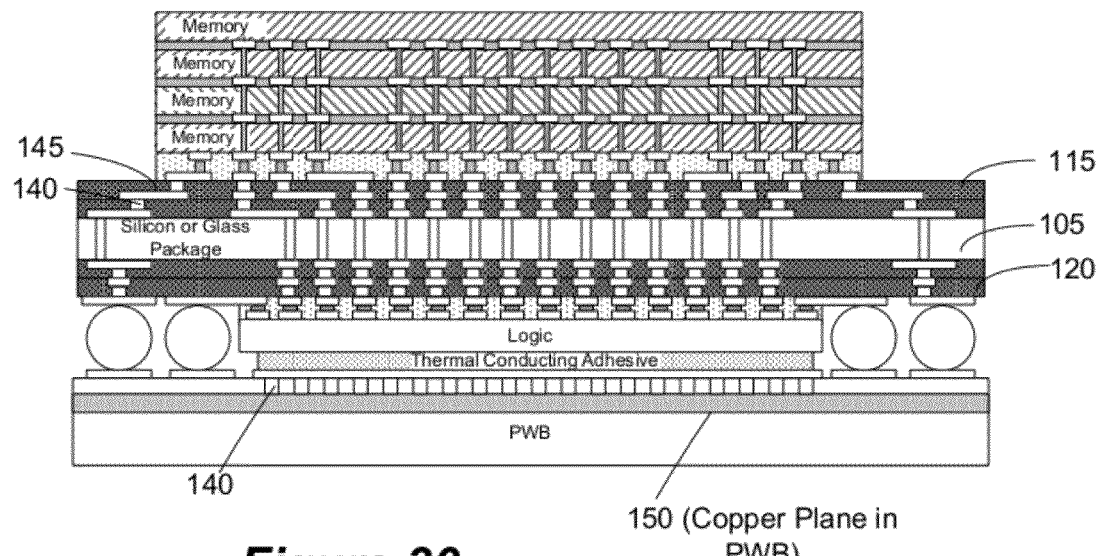

FIG. 30 illustrates a thermally managed interconnect structure of the present invention for a low power logic component.

Figure 31:
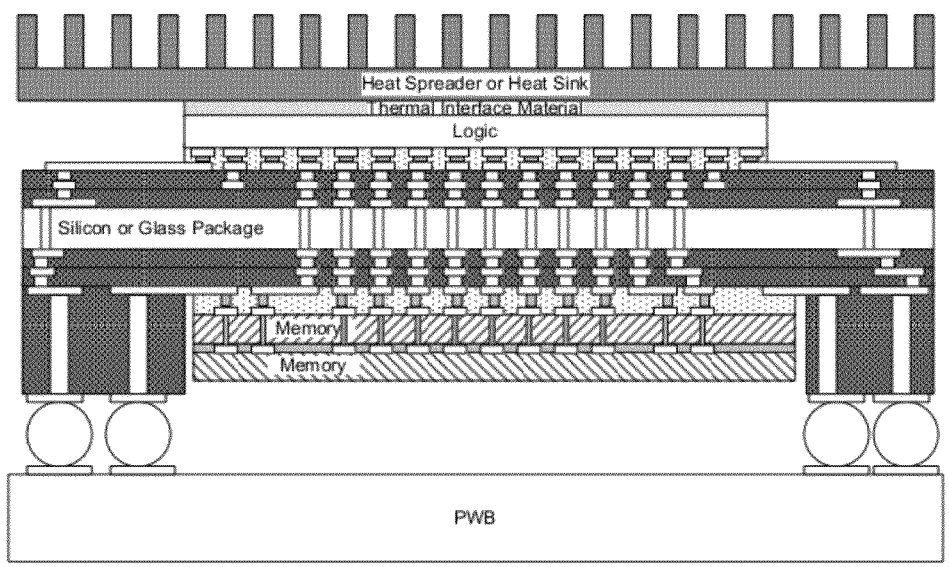

FIG. 31 illustrates a thermally managed interconnect structure of the present invention for a high power logic component.

Figure 32:
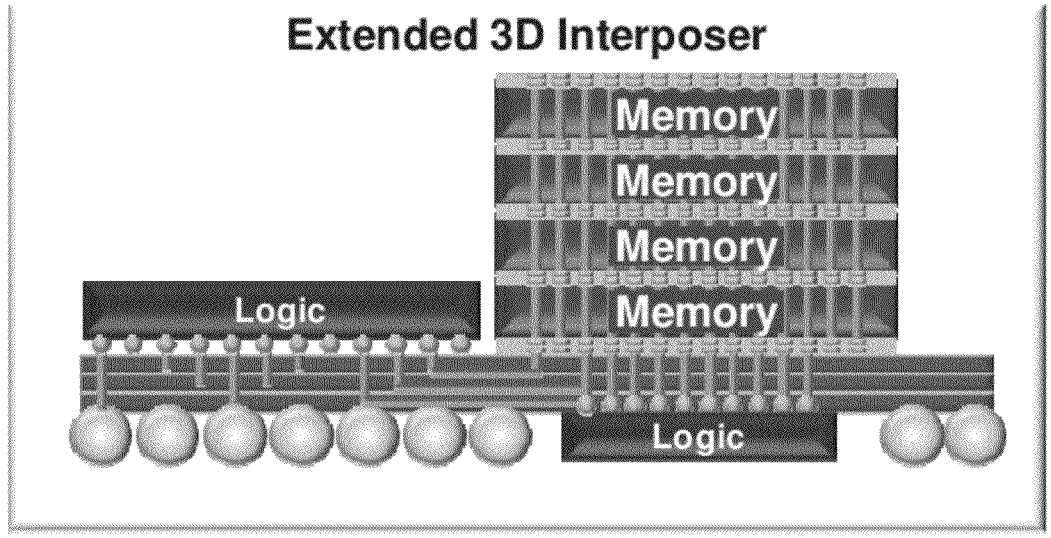

FIG. 32 illustrates a scalable interconnect structure of the present invention in a side-by-side configuration.

Figure 33:
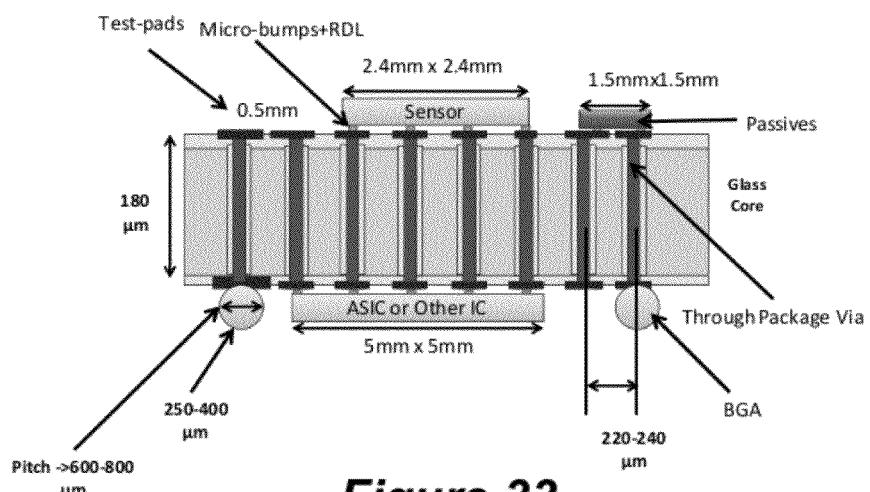

FIG. 33 illustrates an interconnect structure of the present invention configured for a cell phone camera application.

Figure 34:
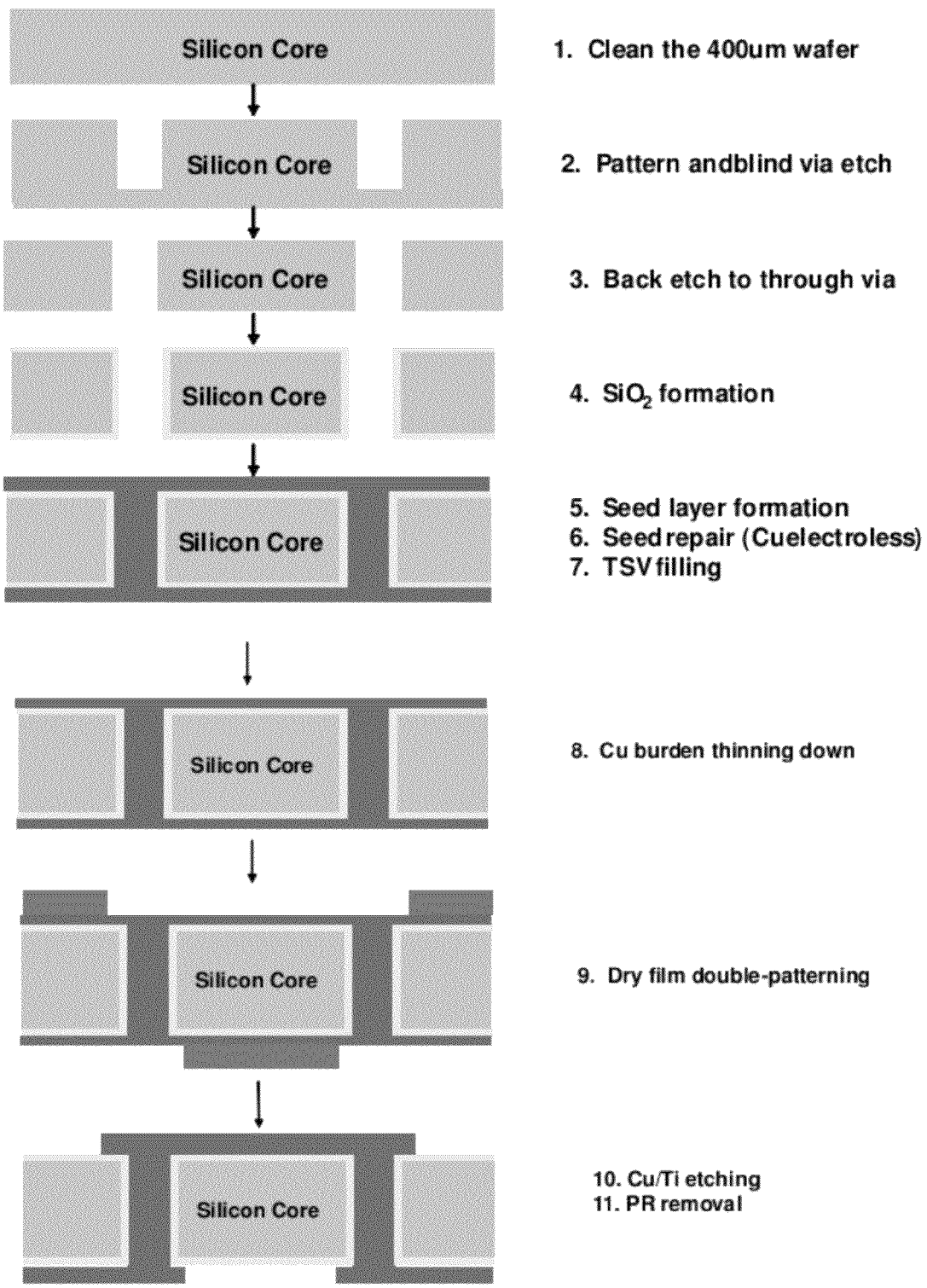

FIG. 34 illustrates a method for fabricating TSVs through a single crystalline silicon interposer.

Figure 35:
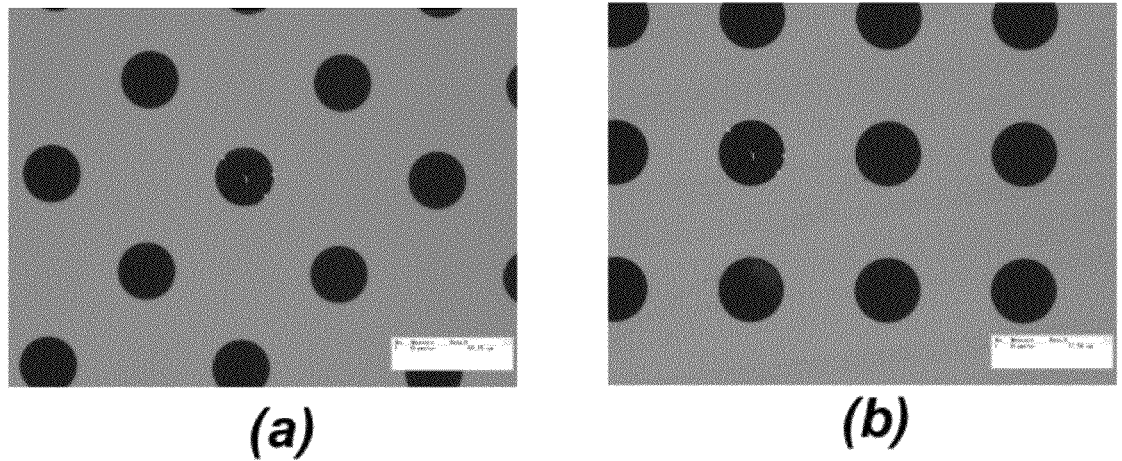

FIGS. 35a and 35b illustrate a typical top and bottom view, respectively, of a circular TSV.

Figure 36:
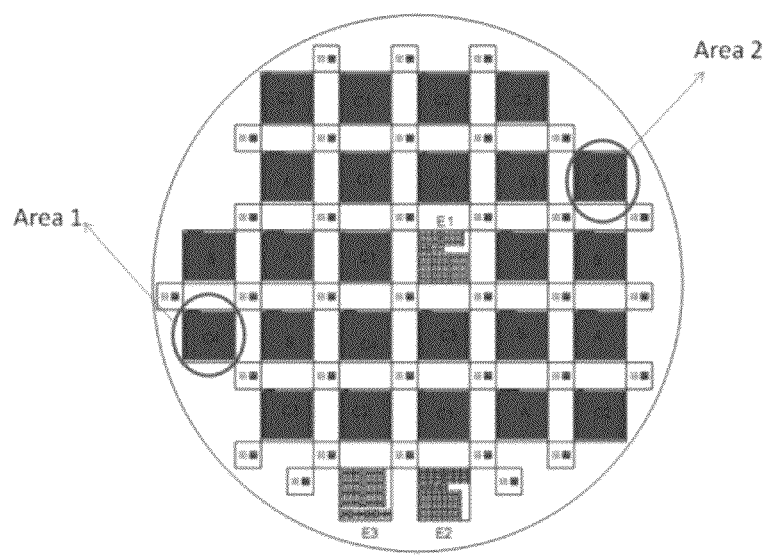

FIG. 36 illustrates a top view of a wafer inspected for a uniform via size.

Figure 37:
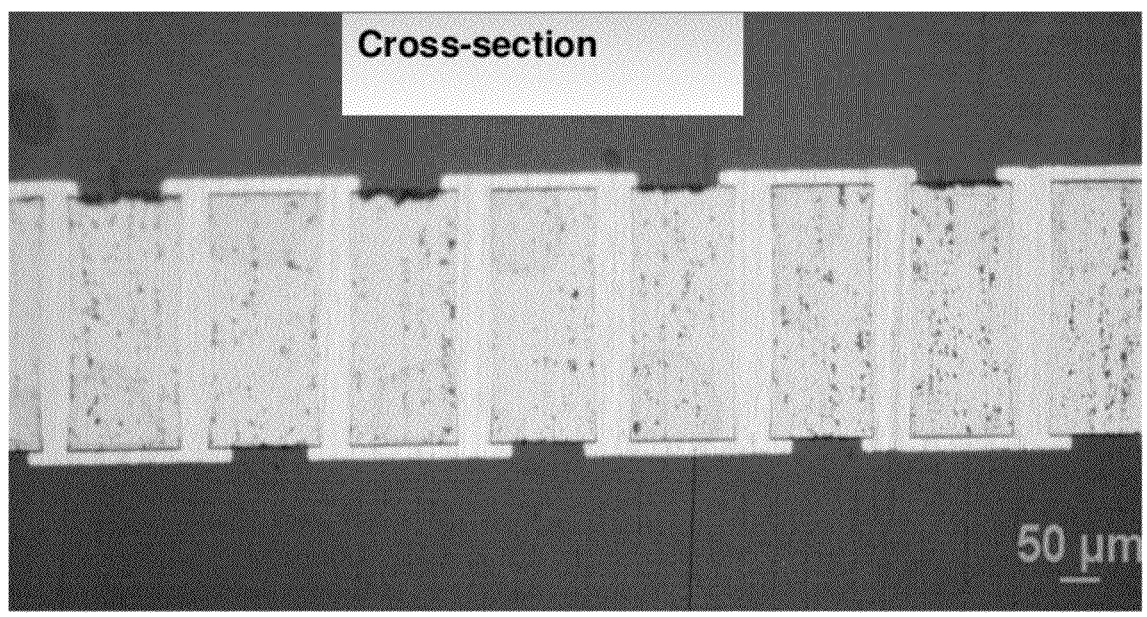

FIG. 37 illustrates the top view and micro-section images of a representative TSV daisy chain with about 65 μm diameter vias

DETAILED DESCRIPTION

Referring now to the figures, wherein like reference numerals represent like parts throughout the several views, exemplary embodiments of the present invention will be described in detail. Throughout this description, various components can be identified as having specific values or parameters, however, these items are provided as exemplary embodiments. Indeed, the exemplary embodiments do not limit the various aspects and concepts of the present invention as many comparable parameters, sizes, ranges, and/or values can be implemented.

It should also be noted that, as used in the specification and the appended claims, the singular forms "a," "an," and "the" include plural references unless the context clearly dictates otherwise. For example, reference to a component is intended also to include composition of a plurality of components. References to a composition containing "a" constituent is intended to include other constituents in addition to the one named. Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Values may be expressed herein as "about" or "approximately" one particular value, this is meant to encompass the one particular value and other values that are relatively close but not exactly equal to the one particular value. By "comprising" or "containing" or "including," it is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

As used herein, the terms "interconnect," "interconnect structure," and "interposer interconnect structure" may be used interchangeably and refer to connecting devices to form a package, module, sub-system or system.

The various embodiments of the present invention provide an interconnect structure comprising an ultra-thin interposer having a plurality of ultra-high density through-via interconnections defined therein. Such an interposer is referred to as a "3D interposer" as it interconnects two or more devices on either side of the interposer with an unprecedented density of interconnections between the two or more devices. The interposer of the present invention thus electrically connects the first and second set of devices at the same or similar through-via density as in the first and second electronic devices. In prior art embodiments, the through vias in the interposer or package were generally of the same surface-mount pitch as the board, typically from 400-1000 microns. The 3D interposer of the present invention provides short, through-via interconnections, not at the board pitch of 400-1000 microns, but at device pitch of 10-30 microns. As illustrated in FIG. 2, the various embodiments of the interconnect structure increases bandwidth between the two electronic devices as compared to other interconnect structures and does so by (1) utilizing an ultra-thin interposer, therefore resulting in ultra-short interconnections, and (2) achieving ultra-fine pitch conductive through-via structures using novel process methods to fabricate such interposers. Further, the interconnect structure of the present invention is scalable, testable, thermal manageable, and can be manufactured at relatively low costs.

Referring to FIG. 3, there is shown an exemplary embodiment of an interconnect structure 100 of the present invention. As illustrated, the interconnect structure comprises an interposer 105 having a first side 115 and a second side 120. The interposer 105 is ultra-thin and is less than about 100 micrometers in thickness. In exemplary embodiments, the interposer 105 is less than about 800 micrometers in thickness, and more specifically about 20-100 micrometers in thickness. In preferred embodiments, the interposer is about 30 micrometers in thickness. The interposer 105 can be made of many substrate materials, for example, glass, silicon, ceramic, polymer-glass laminates, and flexible polymers, and can be of many shapes, for example wafer, small square or rectangular panels, or large panel shapes. In exemplary embodiments, the interposer 105 is made of glass or any other substrate with a thermal conductivity as low as about 5 W/mK or as high as about 125 W/mK, or higher, as in the case of silicon. Glass presents several advantages, namely, silicon-matched coefficient of thermal expansions (CTE), excellent surface flatness, dimensional stability, high electrical resistivity, and thin and large panel availability. These properties enable glass to isolate heat between the two electronic devices it connects on either side. In other exemplary embodiments, the interposer 105 is made from silicon or any other substrate with a thermal conductivity of about 125 W/mK, which is also an advantageous material as it can provide thermal conduction in both x and y directions and can be in either in single crystalline or polycrystalline form.

A plurality of ultra-small through vias 110 can be defined within the interposer 105 such that each of the through vias 110 extends from the first side 115 to the second side 120 of the interposer 105. The interposer thickness to through-via diameter size, referred to as the "aspect ratio," can range from about 1:1 to about 10:1. More specifically, the through vias 110 are ultra-small and can range from about 1-25 micrometers in diameter at about 3-50 micrometers in pitch. In exemplary embodiments, the through vias 110 are about 1-20 micrometers in diameter at about 3-40 micrometers in pitch. The vias are electrically and thermally conducting, and are distributed within the interposer such that they provide localized thermal isolation or thermal conduction between the first and second electronic devices. FIGS. 30 and 31 illustrate a thermally managed interconnect structure of the present invention for both a low and high power logic component, respectively. The through vias 110 can be metalized in such a way that the metallization provides die pad surfaces 135 that correspond to each of the vias 110 on both the first side 115 and the second side 120 of the interposer 105. Specifically, the through vias 110 can be metalized with a highly-conductive metal, for example copper. Further, the through vias 110 can also be metalized with a polymer liner or a metal seeding liner. The die pads 135 that are formed on the first 115 and second sides 120 of the interposer 105 can electrically connect devices using solder, copper bumps with solder caps, copper to copper bonding, adhesive bonding, metallurgical bonding, non-conductive bonding, or combinations thereof.

A first electronic device 125 can be attached to the first side 115 of the interposer 105 and a second electronic device 130 can be attached to the second side 120 of the interposer 105. In exemplary embodiments, the first electronic device 125 can be single or stacked memory IC devices, and the second electronic device 130 can be a logic IC device or devices. It shall be understood that other electronic devices can also be used as the first electronic device 125 and/or the second electronic device 130. For example, an exemplary embodiment of the present 3D interposer can be a digital camera for cell phones, with an image sensor chip on one side and an Asic chip on the other side of the interposer, as illustrated in FIG. 33. The interposer 105 and the through vias 110 work to electrically connect the first electronic device 125 and the second electronic device 130, and have substantially the same through-via interconnect density as the first electronic device 125 or the second electronic device 130 it connects. This enables the first 125 and second 130 electronic devices to communicate at bandwidth speeds of at least about 10 GB/s, as illustrated in FIG. 2. It shall be understood that while the interconnect structure 100 of the present invention is capable of achieving such high bandwidth speeds, the interconnect structure 100 is scalable (e.g., to decrease bandwidth speed) to meet the demands of specific applications.

Unlike many prior art embodiments, the first 125 and second 130 electronic devices can be connected to the interposer 105 in a face to face configuration (i.e., the active device surface is adjacent and first 115 and second 120 sides of the interposer 105). Further, as illustrated in FIG. 3, electronic devices having different I/O pad layouts and sizes can also be connected through the use of blind vias 140 and conductor traces 145 defined within polymer-metal redistribution layers deposited on the first side 115 and second side 120 of the interposer 105.

FIG. 4 illustrates a top view of the interconnect structure 100 showing the first electronic device 125 above the interposer 105, and the second electronic device 130 below the interposer 105. As illustrated, the first electronic device 125 is of a different pad size and configuration than the second electronic device 130, and they are connected with through vias 110, blind vias 140, and conductor traces 145. FIG. 5 shows various exemplary embodiments of the interconnect structure 100, illustrating the versatility in electronic devices and stacking configurations. It shall be understood that not all embodiments of the interconnect structure 100 of the present invention are illustrated and thus, the interconnect structure 100 is in no way intended to be limited solely to these figures. For example, third and fourth electronic devices can be stacked on the first 125 and second 130 electronic devices, respectively to create a 3D configuration. In stacking embodiments, through vias are defined within the first 125 and second 130 electronic devices, as well as the interposer, to facilitate communication with the third and fourth electronic embodiments. Contrastingly, in embodiments that connect first 125 and second 130 electronic devices only (as illustrated in FIG. 3), at least one, if not both, of the electronic devices do not have through vias, which is distinguishable from many prior art embodiments.

The exemplary embodiments of the interconnect structure 100 provide many benefits over the prior art. For example, the interconnect structure 100 of the present invention offers the smallest interconnections (e.g., the plurality of vias 110) that run through the best electrically-insulating substrate (e.g., the glass interposer 105), which reduces latency, signal loss, and power. Further, glass interposers have extremely low electrical loss with respect to signal propagation. This characteristic becomes critical in scenarios where signal lines become longer than a few microns, such as with interposers. Further, glass interposers eliminate the need for through-silicon-vias (TSVs) in the logic IC, which substantially, if not completely, eliminates complications of 3D ICs discussed above. Additionally, the double-side mounting of electronic devices to the interposer 105 allows for the testability of the interposer 105 before and after integrating each of the electronic devices. This integration and testing method is illustrated in FIG. 6. The first step 605 is interposer fabrication with through vias and RDL construction (chip-last); the interposer is tested at this stage. The second step 610 is the assembling, mounting, and testing of the first electronic device; the third step 615 is the assembling, mounting, and testing of the second electronic device. This process alleviates the Known Good Die (KGD) concerns in 3D IC integration because each die can be tested after assembly to the interposer. Further, the interconnect structure 100 of the present invention provides an inclusive system level integration approach allowing 3D ICs to be integrated with and increase the number of dies. The 3D interposer of the present invention is scalable for increased number of dies, not only above and below the interposer but also side by, as illustrated in FIG. 32. This is in contrast to 3D ICs with TSV where, multiple dies over 4 are a problem in the prior art. Furthermore, the interconnect structure of the present invention enables the interposer 105 and the package can be one and the same, in contrast to today's 3D ICs that attach to interposers, which then attach to packages before being assembled onto boards, thus lowering the packaging costs by eliminating complex interposers and packages that are needed for current 3D ICs.

GLASS INTERPOSER EXAMPLES

Example #1

Electrical Modeling of TPVs

The effect of different through-package-via (TPV) formation processes on insertion loss and crosstalk was studied using electromagnetic (EM) simulations. TPVs were modeled and simulated in CST Microwave Studio™ (CST-MWS)—a 3D full-wave Electromagnetic (EM) simulator. The system response was studied up to about 10 gigahertz (GHz). The conceptual TPV model is illustrated in FIG. 7. The model comprises a signal via (marked as 'S' in FIG. 7) surrounded by two ground vias (marked as 'G' in FIG. 7). The signal via was excited by discrete ports on its top and bottom surfaces. Two types of glass substrates were considered in this study—Glass 1 (a low CTE borosilicate glass) and Glass 2 (a high CTE glass). The glass substrate was 180 μm thick and had a 15 μm thick surface polymer liner on its top and bottom surfaces. Two types of liner material were also used—Polymer 1 and Polymer 2. The TPVs were about 30 micrometers (μm) in diameter and about 60 μm in pitch. The TPVs were modeled as completely filled with copper. FIG. 8 shows the insertion loss comparison for the TPVs in different glass and liner material combinations. Notably, changing the glass or liner material had little effect on the TPV loss.

Figure 9:
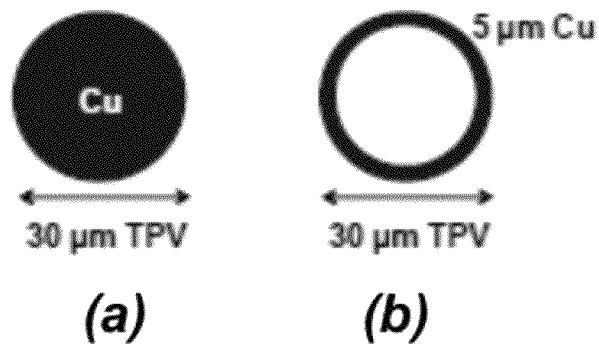

Two types of TPV metallization options were also studied, fully filled Cu and partially or conformally filled Cu, as illustrated in FIG. 9. Glass 2 and Polymer 2 were chosen as the substrate and liner material. The via diameter and pitch were about 30 μm and about 60 μm respectively. The glass thickness was about 180 μm. FIG. 10 shows the simulated insertion loss for the two metallization options. The conformal Cu TPV has almost identical loss behavior as the completely-Cu filled TPV. This can be attributed to skin effect. As demonstrated, any combination of the glass and polymer materials considered in this example can lead to good electrical performance of the TPVs. Conformal Cu TPVs exhibit similar performance as Cu filled TPVs. However, the conformal TPVs are expected to exhibit better thermo-mechanical reliability behavior.

Example #2

Mechanical Design and Modeling of TPVs

Finite Element (FE) models were developed to provide design guidelines for TPV structures in glass interposers. Various combinations of glass and polymer materials were studied in terms of interfacial shear stress ($\sigma_{xy}$) and axial stress in polymer ($\sigma_x$) as metrics representing failure mechanisms for delamination or cracking, respectively. Table 1 shows the material properties used in the FE models, and the models used in the study were subjected to a standard thermal load cycle of about −55 to 125° C.

TABLE 1

|  | Young's Modulus (GPA) | Poisson's Ratio | CTE (ppm/° C.) | Stress free Temp. (° C.) |
|---|---|---|---|---|
| Glass 1 | 77 | 0.22 | 3.8 | 25 |
| Glass 2 | 71 | 0.24 | 8.5 | 25 |
| Polymer 1 | 1.83 | 0.3 | 67 | 232 |
| Polymer 2 | 6.9 | 0.3 | 31 | 120 |
| Copper | 121 | 0.3 | 17.3 | 25 |

Example #3

Fabrication of Ultrafine Pitch TPVs

The biggest challenge with glass interposers is the formation of small vias at fine pitch TPVs (<50 μm) in a cost effective way. Hence there is a need to explore thin glass substrates which will enable ultrafine pitch TPV formation in a faster way. This example focused on excimer laser via formation on ultrathin glass substrates (<200 μm). To enhance the knowledge of excimer laser micro fabrication, two types of drilling techniques—single hole drilling and multiple drilling using mask projection were investigated.

In the case of the single hole drilling, via formation using excimer lasers was carried out on double side polymer-laminated, 175 μm thin Borosilicate glass (BSG). The 50 μm pitch vias demonstrated in the prior art have a conical profile with a flare at the entrance of the via. Such an artifact has been reported in literature and is attributed to laser beam reflections at the glass surface. Using polymer-laminated glass, improved via profiles were obtained with almost vertical and smooth side walls, as illustrated in FIG. 11. The entrance and exit diameters obtained were 27 μm and 15 μm, respectively. The polymer liner on the glass surface helped minimize the laser beam reflections, thus enabling sharp via corners.

Thus far, the throughput of via drilling in a glass substrate has been one of the crucial problems in 3D glass interposer mass production, because conventional laser ablation has been a serial process and ablation rates in glass are much lower than in polymers. This experiment explored a parallel via ablation process using a mask projection technique. As one of the examples of multiple drilling, a mask with a 33×33 array pattern (1089 holes) was used. FIG. 12a shows the top view optical image of TPVs formed in 55 μm ultrathin BSG. More than one thousand uniform vias at a pitch of 30 μm were obtained simultaneously in one laser ablation process. FIG. 12b shows the SEM micrograph of a split cross section of the vias. The entrance and exit diameters obtained were approximately 19 μm and 6 μm, respectively. The obtained side walls were smooth and the vias were formed within 10 seconds. FIG. 13 provides an image of a plated fine pitch via in glass. The mask projection process thus has tremendous potential for low cost via formation of small diameter vias at fine pitch in ultrathin glass.

Example #4

Fine Line Wiring on Glass

Wiring with small line width and line spacing helps interconnect several I/Os between ICs and 3D ICs using a minimum number of routing layers. Fine line wiring on organic packages has been studied using a panel-based, wet processing approach. Wiring on silicon is achieved using wafer-based lithography process that helps achieve feature sizes less than about 1 μm. The favorable dimensional stability and smooth surface of glass facilitates this fine line wiring. However, direct wet metallization on glass has been a challenge due to surface chemistry of glass and its interaction with metals. The presence of a surface polymer, however, on glass facilitates metallization. The glass TPV side walls were subjected to direct metallization using wet electroless copper deposition. A semi-additive plating (SAP) approach was used wherein the fine lines and the through vias were metalized simultaneously. Fine-line and space definitions with dimensions of about 10 μm or less were achieved on polymer-laminated glass cores using dry film and liquid photo-resists. FIGS. 14a and 14b show the definition of fine line and space features down to about 10 μm using about 15 μm thin dry film negative photo-resist. Fine line definition down to about 5 μm was achieved using negative liquid photoresist. After patterning, the features were electroplated with copper to a height of about 5 μm to about 10 μm. Post electroplating, the seed layer was removed after stripping the photo-resist.

Example #5

Glass Test Vehicle Demonstrator

A glass test vehicle was designed and fabricated to characterize the substrate and TPVs in glass. FIG. 15 shows the process flow used for fabricating the test vehicle. A 150 mm×150 mm square glass panel with a thickness of about 180 μm was used for the test vehicle demonstrator. BSG with polymer1 was used for the initial test vehicle fabrication. A key fabrication challenge was the handling of ultrathin glass substrates during the different stages of processing. Glass, being a brittle material, is prone to cracking. The double-side polymer lamination helped enhance the handling of glass by acting as a stress relief layer, providing mechanical support to the glass. Through-vias were formed with entrance and exit diameters of about 130 μm and about 90 μm respectively using laser ablation. Metallization of TPVs and on the surface of glass interposer was carried out using copper as metal and SAP (semi additive plating) approach. The resulting two metal layer structure is shown in FIG. 16a-c.

Ring resonators were designed to extract the dielectric constant and loss tangent of the interposer. FIG. 17 shows the measured and simulated response of the ring resonator up to 20 GHz. The electrical properties of the glass interposer, as shown in Table 2, were extracted from the measurement and simulation data. The interposer demonstrated good electrical properties with a low dielectric constant and loss tangent up to 19.4 GHz. Some structures were designed and fabricated to characterize the electrical characteristics of the interconnections (lines and TPVs) in glass interposer. FIGS. 16c and 18a show the top view and the cross-sectional view of a CPW line to TPV transition structure, respectively. The comparison between the measured and simulation data for this structure is shown in FIG. 18b. It was observed that the simulation results correlate well with the measurement results. The interconnection has low insertion loss (less than 0.15 dB) until 9 GHz.

TABLE 2

| n | Freq. (GHz) | DK($\epsilon_r$) | DF(tan δ) |
|---|---|---|---|
| 1 | 2.44 | 4.73323 | 0.002861 |
| 2 | 4.88 | 4.712096 | 0.002852 |
| 3 | 7.28 | 4.776466 | 0.001906 |
| 4 | 9.72 | 4.754924 | 0.001814 |
| 5 | 12.2 | 4.742063 | 0.001963 |
| 6 | 14.6 | 4.769319 | 0.001979 |
| 7 | 17 | 4.788918 | 0.002104 |
| 8 | 19.4 | 4.803689 | 0.001806 |

POLYCRYSTALLINE SILICON 3D INTERPOSER EXAMPLES

Example #1

Electrical Modeling of TPVs/TSVs

Electromagnetic modeling and simulation results were presented to compare the electrical performance of through silicon vias (TSVs) and TPVs in polycrystalline-silicon interposers. Parametric studies of the TPV diameter and sidewall liner thickness on electrical performance is also presented.

TPVs were modeled and simulated for their electrical characteristics by means of 3D full-wave Electromagnetic (EM) simulations. CST Microwave Studio™ (CST-MWS) was used as a 3D full-wave EM simulator to study the system response of the vias up to 10 GHz. The via model is shown in FIG. 19. The model comprises two signal vias (marked as 'S' in FIG. 19) surrounded by four ground vias (marked as 'G' in FIG. 19). The vias were excited with discrete (lumped) ports on their top and bottom surfaces.

The insertion loss and crosstalk between the vias in two types of Si interposers is compared in FIGS. 20*a* and 20*b*. TPVs in polycrystalline Si (0.15 Ω-cm resistivity) is compared with TSVs in wafer-based CMOS grade Si (10 Ω-cm resistivity). The thickness of the Si substrate was about 220 µm. The diameter and pitch of these Cu filled vias were about 30 µm and about 120 µm, respectively. The TSVs were modeled with about 1 µm thick sidewall $SiO_2$ liner, while the TPVs were modeled with about 5 µm thick sidewall polymer liner.

It is observed from FIGS. 20*a* and 20*b* that the TPVs in polycrystalline Si have lower loss (until about 10 GHz) and lower crosstalk (until about 7 GHz) as compared to the TSVs in CMOS grade Si. The better electrical behavior of the TPVs can be attributed to the thicker polymer lined sidewall and surface liner in these interposers. This helps reduce the substrate loss and coupling in the Si substrate.

The effect of the sidewall liner thickness on the insertion loss and crosstalk in TPVs is studied in FIGS. 21*a* and 21*b*. The TPV diameter and pitch was about 30 µm (diameter of the Cu filled region) and about 120 µm, respectively. The Si substrate resistivity and thickness was about 0.15 Ω-cm and about 220 µm respectively. It is seen from FIGS. 21*a* and 21*b* that the insertion loss and crosstalk can be reduced by using a thicker sidewall polymer liner.

The effect of via diameter on its loss and crosstalk is studied in FIGS. 22*a* and 22*b*. The vias were modeled in about 220 µm thick polycrystalline Si (0.15 Ω-cm resistivity) with about 5 µm thick polymer sidewall liner. The TPV pitch was about 120 µm. The loss in the TPVs can be reduced by decreasing via diameter. Smaller TPVs have smaller sidewall capacitance (due to smaller diameter) and smaller substrate conductance (due to larger spacing between the TPVs). This helps in reducing the loss. Due to the greater spacing between the smaller TPVs, their crosstalk is lower as compared to the larger TPVs.

The performance of TPVs in polycrystalline Si (with thick polymer liner) is better as compared to that of wafer-based CMOS grade Si with thin $SiO_2$ liner. The electrical performance of the TPVs can be improved by decreasing its diameter and by increasing the sidewall liner thickness.

Example #2

Mechanical Design of TPVs/TSVs

Finite Element (FE) modeling was performed using Ansys to compare the proposed TPV structure with a polymer liner to the current 3D IC structure with TSV structure with thin SiO2 liner in terms of interfacial shear stresses ($\sigma_{xy}$) due to thermal loading. The effect of geometry (liner thickness and via diameter) on the axial stress ($\sigma_x$) of a polymer liner in TPV structure was also studied.

The material properties used in the simulations are given in Table 3. A standard thermal load cycle of −55 to 125° C. was used for the analysis.

TABLE 3

|  | Young's Modulus (GPA) | Poisson's Ratio | CTE (ppm/° C.) | Stress free Temp. (° C.) |
| --- | --- | --- | --- | --- |
| Silicon | 185 | 0.28 | 2.6 | 25 |
| Polymer | 6.9 | 0.3 | 31 | 120 |
| Copper | 121 | 0.3 | 17.3 | 25 |
| SiO$_2$ | 70 | 0.3 | 0.5 | 25 |

The interfacial shear stress localization occurs at the Cu-Polymer (about −90 MPa) and Polymer-Si (about 72 MPa) junctions in the case of TPV structures, and at Cu—$SiO_2$ (about 124 MPa) junctions in the case of TSV structures. The relatively higher interfacial shear stress localization in TSV structures can be attributed to the higher CTE mismatch of $SiO_2$ with Cu vias. This makes the standard Si interposers more susceptible to delamination failures compared to TPV structures fabricated with polymer liners. Due to higher stiffness of $SiO_2$, the TSV structures are more prone to cohesive cracks compared to TPV structures. It is also expected that TSV structures would experience higher stress during the back grinding process required for fabricating these structures.

Example #3

TPV Fabrication Process

FIG. 23 illustrates the process flow used to fabricate the TPV in a polycrystalline silicon panel.

Example #4

TPV Formation

Several methods for TPV formation in polycrystalline silicon were explored as the traditional DRIE processes are too slow to drill TPVs in silicon interposers of about 220 µm thick polycrystalline silicon. To solve this problem, TPV formation by laser ablation (UV, excimer and pico-second lasers) was studied. Top and bottom views of the vias fabricated by three types of lasers are compared in FIG. 24.

The UV laser with a wavelength of about 266 nm was faster but resulted in large via entrance diameters ranging from about 75-125 µm. The via exit diameter (ranging from about 50-100 µm) was smaller than the entrance diameter, indicating significant via taper. The excimer laser was able to drill smaller vias (about 10-20 µm diameter) than the UV laser. The excimer laser was able to form nearly vertical TPV sidewall without micro-cracking due to minimal thermal damage to the silicon material. Excimer laser processing can be scaled to higher throughput by parallel mask projection ablation. Picosecond lasers can further reduce the heat generated during the laser ablation process. TPVs with about 10-50 µm diameter were formed by pico-second laser. However, this method is currently limited by slow processing speed and serial via formation process.

For this initial study, short wavelength UV lasers were chosen for TPV formation in polycrystalline silicon. FIG. 25 shows a typical cross section picture of a laser ablated through-via in polycrystalline silicon.

Example #5

Polymer filling and Liner Formation

A novel polymer liner approach is presented to replace the current combination of $SiO_2$ and diffusion barriers used in the processing of CMOS-based silicon interposers. The technical approach involves polymer filling of TPV, followed by laser ablation to form an "inner" via resulting in a via side wall liner of controlled thickness.

The laser drilled silicon samples were first cleaned using a plasma treatment. About 30 μm thick polymer film was laminated to cover the surface and fill the TPVs. This was done by an optimized double-side lamination process with hot press, resulting in void-free filling without cracking the silicon. FIG. 26 shows the optical cross-sectional image of polymer laminated silicon substrate with polymer-filled TPV (about 125 μm and about 100 μm via entrance and exit diameter respectively). Adhesion between polymer and silicon was checked by initial tape test for peel strength and the samples showed good adhesion.

UV laser ablation was used to drill through holes in the polymer filled vias. The inner via diameter was controlled to ensure proper sidewall polymer liner thickness.

Example #6

TPV Metallization

The TPV metallization consisted of two steps: 1) Cu seed layer formation, and 2) Cu electroplating. Electroless plating, a fast, low cost process, was used in this study to form an about 0.5-1 μm thick copper seed layer for further electroplating. The polycrystalline silicon sample with via in polymer was first cleaned using plasma to remove any impurities on the surface. After rinsing the sample, Cu was plated by electroless deposition on the top and bottom surfaces of the sample, and along the via side wall. A fast, void-free electroplating was performed to fill the vias with Cu. Alternate filling methods to improve the throughput of the via metallization are under investigation.

Example #7

Test Vehicle Fabrication and Characterization

A demonstrator test vehicle was designed and fabricated using the process flow diagram as shown in FIG. 27. TPVs were drilled in about 6 inch sized polycrystalline silicon panels by using a UV laser. Polymer was laminated on both sides to fill the via hole. Laser ablation was performed in the filled polymer to form the TPV liner. After surface cleaning, dry film photoresist was laminated on both sides and photolithography was performed. After patterning the sample, a semi-additive Cu electroplating was performed to fill the TPVs and to form the redistribution layer (about 5 μm thick). Finally, the photoresist and seed layers were removed sequentially.

Fine line structures were also fabricated on the test vehicle. FIG. 28 shows the cross-section picture of the fine line structure on polymer laminated polycrystalline silicon. The fabrication resulted in fine line and space features down to about 20 μm.

Co-planar waveguide (CPW) transmission lines were designed and fabricated along with other electrical characterization structures. The structures were measured in a VNA after performing SOLT calibrations.

FIG. 29 illustrates the simulation and measurement results of an about 6.2 mm long CPW line. It is observed that the transmission lines have less than 2 dB insertion loss at 9 GHz. This translates to a loss of 0.3 dB/mm at 9 GHz.

SINGLE CRYSTAL SILICON INTERPOSER EXAMPLES

Example #1

Process Optimization, Integration, and Fabrication

TSVS were fabricated on 4" wafers according to the process flow illustrated in FIG. 34. After cleaning the 400 μm wafer substrate, lithography was performed to pattern the TSV structures using Dow Chemical SPR220 positive acting photoresist and Karl Suss MA-6 Mask Aligner. The recipe for the photoresist was about 1000 rpm/500R/S/5s and then about 2000 rpm/1000R/S/40s. The average thickness of the photoresist was about 7.5 μm. After about 35 minutes of baking dry and exposure, the photoresist was developed by using MF-319 developer.

After the lithography process, the sample wafer was attached to a handle wafer and then put into the STS-ICP machine for blind via etching using Bosch Process. In the process of blind via etching, the larger features have faster etching and vias with similar dimensions have similar etching speed. For example, after 550 cycles etching in STS ICP, all circular TSVs with about 65 μm diameter had a similar etch depth of about 285 μm compared to about 40 μm circular TSVs with a lower etch depth of about 260 μm. After blind via etching, back grinding, and final polish was used to expose the backside of the vias to form through vias. In order to open the about 40 μm diameter alignment vias on the back side, the wafer was thinned down to about 260 μm. FIGS. 35*a* and 35*b* shows a typical top and bottom view, respectively, of a circular TSV (about 65 μm) after back grinding and polishing.

Wafer Inspection was also done for about 65 μm via size uniformity across the wafer (from area 1 and area 2 in the mask layout shown in FIG. 36) and across the five wafers in the batch. The results are shown in Table 4 and uniform via size distribution was observed for both top and bottom sides. However, the diameters of bottom vias are always about 8-9 μm larger than the top ones.

TABLE 4

|  | Top via size (μm) | | Bottom via size (μm) | | Average Size Difference (μm) |
| --- | --- | --- | --- | --- | --- |
|  | Area 1 | Area 2 | Area 1 | Area 2 | Bottom-rop |
| Wafer 1 | 68.35 | 69.92 | 77.59 | 77.76 | 8.45 |
| Wafer 2 | 67.52 | 69.5 | 76.61 | 77.97 | 8.1 |
| Wafer 3 | 68.44 | 70.39 | 78.83 | 76.97 | 9.41 |
| Wafer 4 | 69.72 | 69.75 | 78.1 | 77.62 | 8.36 |
| Wafer 5 | 69 | 70.22 | 78.05 | 79 | 8.44 |

After removing the residual photoresist by using Acetone, a 2 μm thick $SiO_2$ dielectric isolation layer was deposited by plasma enhanced chemical vapor deposition process at about 250° C. on both sides of the wafer using a Plasma-Therm PECVD or STS-PECVD tool. About 30 nanometer (nm) Ti (barrier for Cu diffusion into $SiO_2$) and about 1 μm thick copper seed layer were grown on both sides of the sample wafer by using CVC DC Sputter to provide the electrical contact for the electroplating process. The sequence of barrier and seed layer sputter deposition for the through-vias was Ti/Cu sputter on side 1, followed by flipping the wafer and Ti/Cu sputtering on side 2 to get complete coverage on the through-via. For high aspect ratio vias, Cu electroless plating process was used to deposit a thin layer of Cu to ensure complete coverage of the metal seed and fix any spots on the via side wall where the sputtered seed layer was not able to reach. A DC electroplating process was then used to plate copper and fill the TSVs. The holding time between seed repair and electroplating was minimized in order to avoid oxidation of Cu and a 10% sulfuric acid clean was performed for about 1-2 minutes just before the electroplating step. A current of about 4 amps (A) was used for about 8 hours in this process. The final thickness of the Cu burden on both sides was around 80 μm, which was then thinned down during the Cu pad formation process.

The Cu pad formation process starts with thinning of the Cu burden by double sided micro-etch process using a dilute $CuCl_2$ solution. The target finished Cu thickness was about 12-15 μm. After thinning the Cu burden, a double-sided lithography process was done using dry film photoresist applied to the thin wafer by vacuum lamination. The UV exposure was done with precise alignment using a mask aligner, followed by spray developing using a 1% sodium carbonate solution. The patterned photoresist mask was used to etch back the Cu by wet etching ($CuCl_2$ chemistry), followed by Ti seed removal using wet or dry etching. The final step in the process sequence was stripping of the photoresist using a potassium hydroxide solution to result in Cu pad structures. FIG. 37 illustrates the top view and micro-section images of a representative TSV daisy chain with about 65 μm diameter vias. The defined copper pads for the through vias can be seen on both sides of the wafer with a thickness of about 260 μm.

Example #2

Reliability Testing

The first wafer with fully fabricated TSV coupons had a yield of 18 working daisy chain coupons of about 65 μm diameter out of a total of 25 coupons in the mask layout. Daisy chain resistance was measured as-fabricated, using both four point and two point probe setups. The two point probe setup was used for monitoring the daisy chain resistance through thermal cycling. The total resistance of an individual daisy chain coupon was measured to be in the range of few ohms, which includes the resistance of traces on both sides and contact resistance from the probing in addition to the TSV resistance. JEDEC standard thermal cycle tests are in progress from −40° C. to 125° C. after MSL-3 preconditioning. Early results from the first 300 cycles indicate some failures in the periphery of the wafer, while the resistance in the interior coupons is quite stable.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

We claim:

1. A three-dimensional (3D) glass interposer interconnect structure, comprising:
a glass interposer having a first side and a second side, the glass interposer being 20 microns to 100 microns in thickness; and
a plurality of through-vias defined within the glass interposer extending at least from the first side to the second side of the glass interposer;
wherein the glass interposer electrically connects first and second electronic devices on either side of the through-vias and has the same or substantially the same through-via interconnect density as the first and second electronic devices it connects; and
wherein the plurality of through-vias are 3 microns to 50 microns in pitch and 1 micron to 25 microns in diameter.

2. The interconnect structure of claim 1, wherein the first electronic device is attached to the first side of the glass interposer and the second electronic device is attached to the second side of the interposer.

3. The interconnect structure of claim 1, further comprising a plurality of blind vias and a plurality of conductor traces defined within a redistribution layer on the first side and the second side of the glass interposer, wherein the blind vias and conductor traces enable the interposer to electrically connect to first and second electronic devices of different input/output (I/O) pad layouts and sizes.

4. The interconnect structure of claim 1, wherein the first and second electronic devices communicate at a bandwidth of at least 10 GB/s.

5. The interconnect structure of claim 1, wherein the first and second electronic devices communicate at a bandwidth of at least 12 GB/s.

6. The interconnect structure of claim 1, wherein the through-vias are metalized.

7. The interconnect structure of claim 6, wherein the through-vias are metalized with copper.

8. The interconnect structure of claim 6, wherein the through-vias are metalized with a low coefficient of thermal expansion (CTE) conductive alloy.

9. The interconnect structure of claim 6, wherein the through-vias are metalized with a thick polymer liner.

10. The interconnect structure of claim 6, wherein the through-vias are metalized with a seeding metal liner for subsequent electroplating.

11. The interconnect structure of claim 1, wherein the first electronic device is a logic device.

12. The interconnect structure of claim 1, wherein the second electronic device is a memory device.

13. The interconnect structure of claim 1, wherein the glass interposer is 20 to 50 micrometers in thickness.

14. The interconnect structure of claim 1, wherein the plurality of through-vias are 1 to 20 micrometers in diameter.

15. The interconnect structure of claim 1, wherein the plurality of through-vias are 3 to 30 micrometers in pitch.

16. The interconnect structure of claim 1, wherein the first and second electronic devices are connected to the glass interposer in a face-to-face configuration.

17. The interconnect structure of claim 1, wherein the first and second devices are electrically connected to pads or through-vias on the first and second sides of the glass interposer, respectively, using solder, copper bumps with solder caps, copper-to-copper bonding, adhesive bonding, metallurgical bonding, non-conductive bonding, or combinations thereof.

18. The interconnect structure of claim 1, wherein at least one of the first and second electronic devices does not comprise through-vias.

19. The interconnect structure of claim 1, further comprising:
- a third and fourth electronic device, wherein the third and fourth electronic devices are stacked on the first and second electronic devices, respectively, in a three-dimensional (3D) configuration; and wherein the first and second electronic devices comprise a plurality of through-vias to electrically communicate with the third and fourth electronic devices, respectively.

20. The interconnect structure of claim 1, wherein the glass interposer is a large panel.

21. A testable glass interposer interconnect structure, comprising:
- a glass interposer having a first side and a second side, the glass interposer being 20 microns to 100 microns in thickness; and
- a plurality of through-vias defined within the glass interposer extending at least from the first side to the second side of the glass interposer;
- wherein the glass interposer electrically connects first and second electronic devices on either side of the through-via and has the same or substantially the same through-via interconnect density as the first and second electronic devices it connects;
- wherein the glass interposer comprises test pads on the first and second sides of the glass interposer to enable testing of electronic devices attached and electrically connected to at least one of the first and second sides of the glass interposer; and
- wherein the plurality of through-vias are 3 microns to 50 microns in pitch and 1 micron to 25 microns in diameter.

22. The interconnect structure of claim 21, wherein electrical package test methods are applied to verify the functioning of the glass interposer, the glass interposer with the first electronic device on the first side of the glass interposer, followed by the second electronic device mounted on the second side of the glass interposer.

23. A thermally-manageable glass interposer interconnect structure, comprising:
- a glass interposer having a first side and a second side, the glass interposer being 20 microns to 100 microns in thickness; and
- a plurality of through-vias defined within the interposer extending at least from the first side to the second side of the glass interposer; and
- wherein the glass interposer electrically connects first and second electronic devices on either side of the through-via and has the same or substantially the same through-via interconnect density as the first and second electronic devices it connects;
- wherein either the first or the second electronic devices have exposed surfaces for bonding thermal heatsinks or other thermal structures and are connected by a plurality of electrically and thermally conducting through-vias, wherein the plurality of through-vias are distributed within the glass interposer and provide localized thermal isolation or thermal conduction between the first and second electronic devices; and
- wherein the plurality of through-vias are 3 microns to 50 microns in pitch and 1 micron to 25 microns in diameter.

24. The interconnect structure of claim 23, wherein the glass interposer provides thermal conduction in X and Y plane directions.

25. A scalable glass interposer interconnect structure, comprising:
- a glass interposer having a first side and a second side, the glass interposer being 20 microns to 100 microns in thickness; and
- a plurality of through-vias defined within the glass interposer extending at least from the first side to the second side of the glass interposer;
- wherein the glass interposer electrically connects electronic devices and has the same through-via interconnect density as the electronic devices it connects; and
- wherein a plurality of electronic devices are attached to the first side of the glass interposer in a side-by-side configuration; and
- wherein the plurality of through-vias are 3 microns to 50 microns in pitch and 1 micron to 25 microns in diameter.

26. The interconnect structure of claim 25, wherein a plurality of electronic devices are attached to the second side of the glass interposer in a side-by-side configuration.

* * * * *